(12) United States Patent
Bauer et al.

(10) Patent No.: US 7,706,046 B2
(45) Date of Patent: Apr. 27, 2010

(54) REARVIEW MIRROR ELEMENT HAVING A CIRCUIT MOUNTED TO THE REAR SURFACE OF THE ELEMENT

(75) Inventors: Frederick T. Bauer, Holland, MI (US); Robert R. Turnbull, Holland, MI (US); Thomas F. Guarr, Holland, MI (US); Leroy J. Kloeppner, Jenison, MI (US); David L. Eaton, Holland, MI (US); Joel A. Stray, Hudsonville, MI (US); Barry K. Nelson, Howard City, MI (US)

(73) Assignee: Gentex Corporation, Zeeland, MI (US)

( * ) Notice: Subject to any disclaimer, the term of this patent is extended or adjusted under 35 U.S.C. 154(b) by 862 days.

(21) Appl. No.: 10/863,638

(22) Filed: Jun. 8, 2004

(65) Prior Publication Data

US 2005/0270620 A1 Dec. 8, 2005

(51) Int. Cl.
*G02F 1/153* (2006.01)
(52) U.S. Cl. ...................................... 359/267; 359/265
(58) Field of Classification Search .......... 359/265–275
See application file for complete search history.

(56) References Cited

U.S. PATENT DOCUMENTS

| 1,096,452 | A | 5/1914 | Perrin |
| 1,563,258 | A | 11/1925 | Cunningham |
| 2,457,348 | A | 12/1948 | Chambers |
| 2,561,582 | A | 7/1951 | Marbel |
| 3,728,501 | A | 4/1973 | Larson et al. |
| 3,987,259 | A | 10/1976 | Larson |
| 4,274,078 | A | 6/1981 | Isobe et al. |
| 4,423,299 | A | 12/1983 | Gurol et al. |
| 4,733,335 | A | 3/1988 | Serizawa et al. |

(Continued)

FOREIGN PATENT DOCUMENTS

CA    2028461    11/1994

(Continued)

OTHER PUBLICATIONS

Roberts, John K., "Dichroic Mirrors with Semi-active Covert Displays," Interior & Exterior Systems, International Body Engineering Conf. Sep. 21-23, 1993, pp. 65-69.

*Primary Examiner*—Scott J Sugarman
*Assistant Examiner*—Tuyen Q Tra
(74) *Attorney, Agent, or Firm*—Price, Heneveld, Cooper, DeWitt & Litton, LLP

(57) ABSTRACT

According to the present invention, a rearview mirror comprises a first substrate having a front surface and a rear surface, a reflective coating disposed on a surface of the first substrate, and an electronic circuit component secured to the rear surface of the first substrate. The mirror element may be an electrochromic mirror element comprising a transparent second substrate positioned in front of the first substrate. The electronic component secured to the rear surface may be a component of a drive circuit for the electrochromic mirror element. The rearview mirror element may further comprise electrically conductive tracings provided on the rear surface of the first substrate electrically coupled to the electrical component. The tracings may be used to electrically couple the drive circuit to the electrodes of the electrochromic mirror element. The tracings may be deposited on the rear surface using numerous methods including inkjet printing techniques.

57 Claims, 17 Drawing Sheets

U.S. PATENT DOCUMENTS

| | | | |
|---|---|---|---|
| 4,803,599 A | 2/1989 | Trine et al. | |
| 4,827,086 A | 5/1989 | Rockwell | |
| 4,855,550 A | 8/1989 | Schultz, Jr. | |
| 4,859,813 A | 8/1989 | Rockwell | |
| 5,014,167 A | 5/1991 | Roberts | |
| 5,016,996 A | 5/1991 | Ueno | |
| 5,017,903 A | 5/1991 | Krippelz, Sr. | |
| 5,059,015 A | 10/1991 | Tran | |
| 5,151,824 A | 9/1992 | O'Farrell et al. | |
| 5,207,492 A | 5/1993 | Roberts | |
| 5,313,335 A | 5/1994 | Gray et al. | |
| 5,355,284 A | 10/1994 | Roberts | |
| 5,361,190 A | 11/1994 | Roberts et al. | |
| 5,371,659 A | 12/1994 | Pastrick et al. | |
| 5,401,922 A | 3/1995 | Asta | |
| 5,402,103 A | 3/1995 | Tashiro | |
| 5,436,741 A | 7/1995 | Crandall | |
| D363,920 S | 11/1995 | Roberts et al. | |
| 5,481,409 A | 1/1996 | Roberts | |
| 5,497,305 A | 3/1996 | Pastrick et al. | |
| 5,497,306 A | 3/1996 | Pastrick | |
| 5,528,422 A | 6/1996 | Roberts | |
| 5,587,699 A | 12/1996 | Faloon et al. | |
| 5,604,606 A | 2/1997 | Miyashita et al. | |
| 5,610,380 A | 3/1997 | Nicolaisen | |
| 5,619,374 A | 4/1997 | Roberts | |
| 5,619,375 A | 4/1997 | Roberts | |
| 5,632,551 A | 5/1997 | Roney et al. | |
| 5,669,699 A | 9/1997 | Pastrick et al. | |
| 5,669,704 A | 9/1997 | Pastrick | |
| 5,669,705 A | 9/1997 | Pastrick et al. | |
| 5,673,041 A | 9/1997 | Chatigny et al. | |
| 5,680,245 A * | 10/1997 | Lynam | 359/265 |
| 5,748,172 A * | 5/1998 | Song et al. | 345/111 |
| D394,833 S | 6/1998 | Muth | |
| 5,788,357 A | 8/1998 | Muth et al. | |
| 5,796,176 A | 8/1998 | Kramer et al. | |
| 5,798,575 A | 8/1998 | O'Farrell et al. | |
| 5,818,625 A | 10/1998 | Forgette et al. | |
| 5,823,654 A | 10/1998 | Pastrick et al. | |
| 5,825,527 A | 10/1998 | Forgette et al. | |
| 5,863,116 A | 1/1999 | Pastrick et al. | |
| 5,879,074 A | 3/1999 | Pastrick | |
| D409,540 S | 5/1999 | Muth | |
| 5,938,320 A | 8/1999 | Crandall | |
| 5,959,367 A | 9/1999 | O'Farrell et al. | |
| 5,973,283 A | 10/1999 | Ariga et al. | |
| 6,005,724 A | 12/1999 | Todd | |
| 6,007,222 A | 12/1999 | Thau | |
| 6,045,243 A | 4/2000 | Muth et al. | |
| D425,466 S | 5/2000 | Todd et al. | |
| 6,062,920 A | 5/2000 | Jordan et al. | |
| 6,064,508 A | 5/2000 | Forgette et al. | |
| D426,506 S | 6/2000 | Todd et al. | |
| D426,507 S | 6/2000 | Todd et al. | |
| D427,128 S | 6/2000 | Mathieu | |
| 6,074,077 A | 6/2000 | Pastrick et al. | |
| 6,076,948 A | 6/2000 | Bukosky et al. | |
| D428,372 S | 7/2000 | Todd et al. | |
| D428,373 S | 7/2000 | Todd et al. | |
| 6,086,229 A | 7/2000 | Pastrick | |
| 6,089,721 A * | 7/2000 | Schierbeek | 359/603 |
| 6,093,976 A | 7/2000 | Kramer et al. | |
| D428,842 S | 8/2000 | Todd et al. | |
| D429,202 S | 8/2000 | Todd et al. | |
| D430,088 S | 8/2000 | Todd et al. | |
| 6,099,155 A | 8/2000 | Pastrick et al. | |
| 6,111,683 A | 8/2000 | Cammenga et al. | |
| 6,111,684 A | 8/2000 | Forgette et al. | |
| 6,124,886 A | 9/2000 | DeLine et al. | |
| 6,142,656 A | 11/2000 | Kurth | |
| 6,146,003 A | 11/2000 | Thau | |
| 6,149,287 A | 11/2000 | Pastrick et al. | |
| 6,152,590 A | 11/2000 | Furst et al. | |
| 6,163,083 A | 12/2000 | Kramer et al. | |
| 6,166,848 A | 12/2000 | Cammenga et al. | |
| 6,170,956 B1 | 1/2001 | Rumsey et al. | |
| 6,175,164 B1 | 1/2001 | O'Farrell et al. | |
| 6,176,602 B1 | 1/2001 | Pastrick et al. | |
| 6,195,136 B1 | 2/2001 | Handschy et al. | |
| 6,195,194 B1 | 2/2001 | Roberts et al. | |
| 6,206,533 B1 | 3/2001 | Boddy et al. | |
| 6,206,553 B1 | 3/2001 | Boddy et al. | |
| 6,227,689 B1 | 5/2001 | Miller | |
| 6,234,651 B1 | 5/2001 | Kodama et al. | |
| 6,244,716 B1 | 6/2001 | Steenwyk et al. | |
| 6,257,746 B1 | 7/2001 | Todd et al. | |
| 6,264,353 B1 | 7/2001 | Carraher et al. | |
| 6,276,821 B1 | 8/2001 | Pastrick et al. | |
| 6,280,069 B1 | 8/2001 | Pastrick et al. | |
| 6,296,379 B1 | 10/2001 | Pastrick | |
| 6,299,333 B1 | 10/2001 | Pastrick et al. | |
| 6,336,737 B1 | 1/2002 | Thau | |
| 6,340,849 B1 | 1/2002 | Kramer et al. | |
| 6,340,850 B2 | 1/2002 | O'Farrell et al. | |
| 6,347,880 B1 | 2/2002 | Furst et al. | |
| 6,356,376 B1 | 3/2002 | Tonar et al. | |
| 6,379,013 B1 | 4/2002 | Bechtel et al. | |
| 6,416,208 B2 | 7/2002 | Pastrick et al. | |
| 6,420,800 B1 | 7/2002 | LeVesque et al. | |
| 6,426,568 B2 | 7/2002 | Turnbull et al. | |
| 6,441,943 B1 | 8/2002 | Roberts et al. | |
| 6,471,362 B1 | 10/2002 | Carter et al. | |
| 6,512,203 B2 * | 1/2003 | Jones et al. | 219/219 |
| 6,614,579 B2 | 9/2003 | Roberts et al. | |
| 6,621,616 B1 | 9/2003 | Bauer et al. | |
| 6,639,360 B2 * | 10/2003 | Roberts et al. | 313/512 |
| 6,650,457 B2 | 11/2003 | Busscher et al. | |
| 6,679,608 B2 | 1/2004 | Bechtel et al. | |
| 6,700,692 B2 | 3/2004 | Tonar et al. | |
| 6,737,629 B2 | 5/2004 | Nixon et al. | |
| 6,749,308 B1 * | 6/2004 | Niendorf et al. | 359/877 |
| 6,755,542 B2 | 6/2004 | Bechtel et al. | |
| 6,805,474 B2 | 10/2004 | Walser et al. | |
| 6,831,268 B2 | 12/2004 | Bechtel et al. | |
| 6,870,656 B2 * | 3/2005 | Tonar et al. | 359/265 |
| 6,928,366 B2 * | 8/2005 | Ockerse et al. | 701/224 |
| 7,081,888 B2 | 7/2006 | Cok et al. | |
| 7,154,657 B2 * | 12/2006 | Poll et al. | 359/265 |
| 7,255,451 B2 * | 8/2007 | McCabe et al. | 359/605 |
| 7,287,868 B2 * | 10/2007 | Carter et al. | 359/871 |
| 2002/0126497 A1 | 9/2002 | Pastrick | |
| 2004/0061920 A1 | 4/2004 | Tonar et al. | |
| 2004/0095632 A1 * | 5/2004 | Busscher et al. | 359/265 |
| 2005/0099693 A1 | 5/2005 | Schofield et al. | |
| 2005/0195488 A1 * | 9/2005 | McCabe et al. | 359/603 |
| 2005/0264891 A1 * | 12/2005 | Uken et al. | 359/606 |

FOREIGN PATENT DOCUMENTS

| | | |
|---|---|---|
| EP | 0240226 A2 | 10/1987 |
| EP | 0450162 | 12/1990 |
| EP | 0531143 A2 | 3/1993 |
| GB | 2161440 | 1/1986 |
| WO | 8902135 | 3/1989 |
| WO | WO 9530495 A1 | 11/1995 |
| WO | WO 9940039 | 8/1999 |
| WO | WO 0030893 | 6/2000 |
| WO | WO 03103338 A2 | 12/2003 |

* cited by examiner

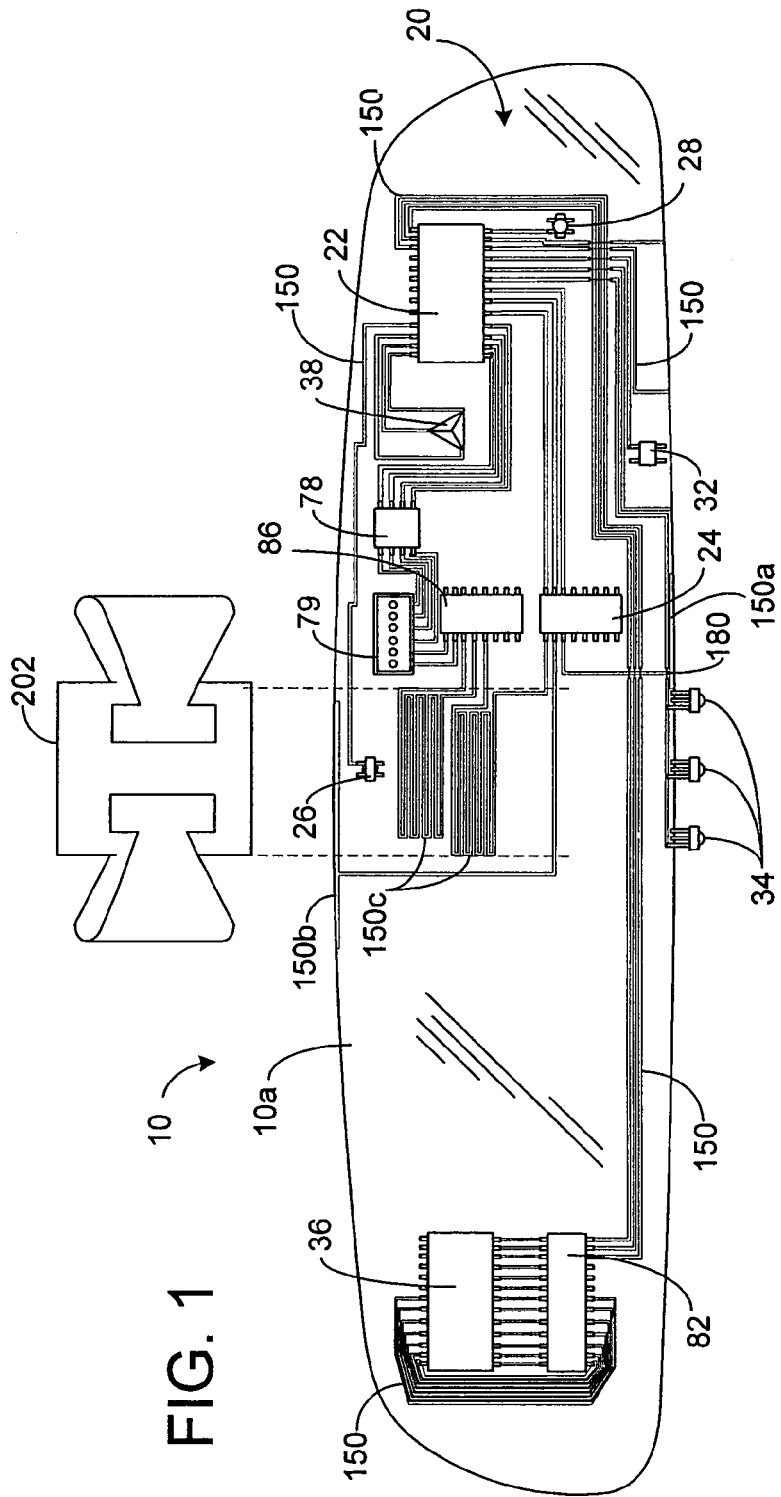
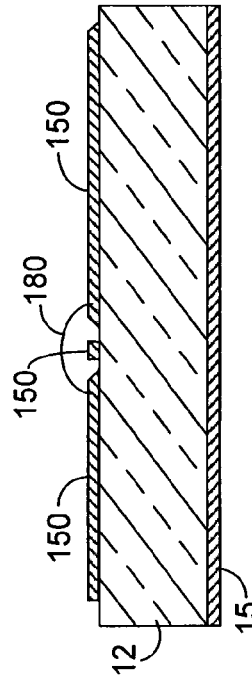
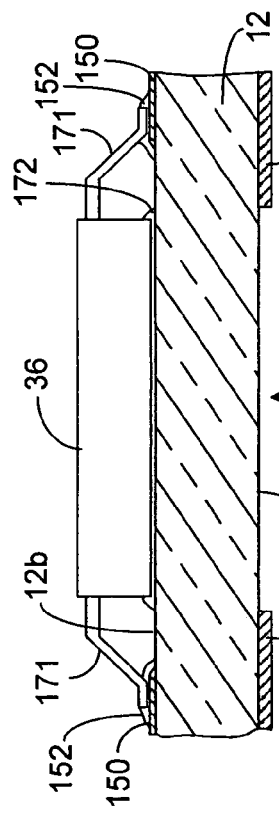
FIG. 1
FIG. 7
FIG. 6

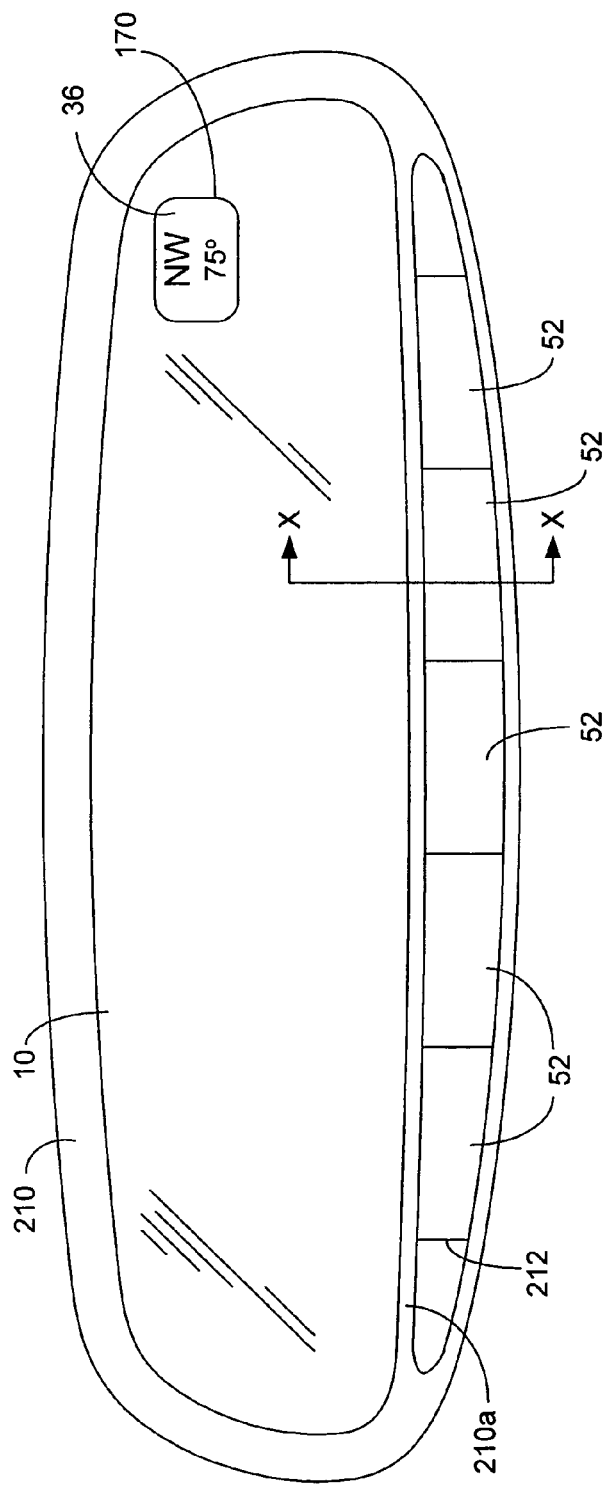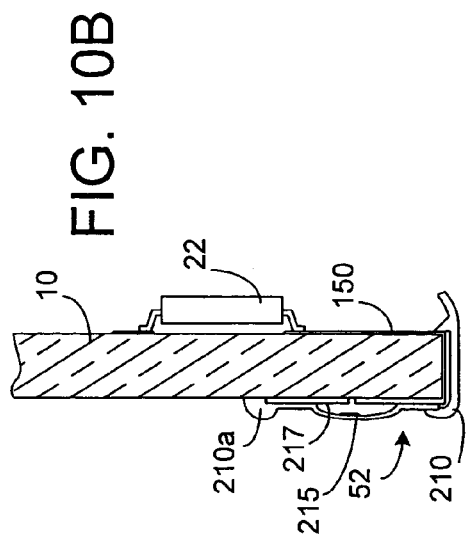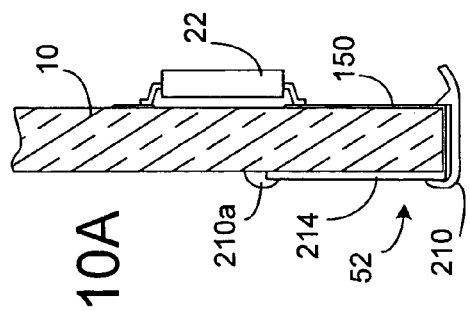

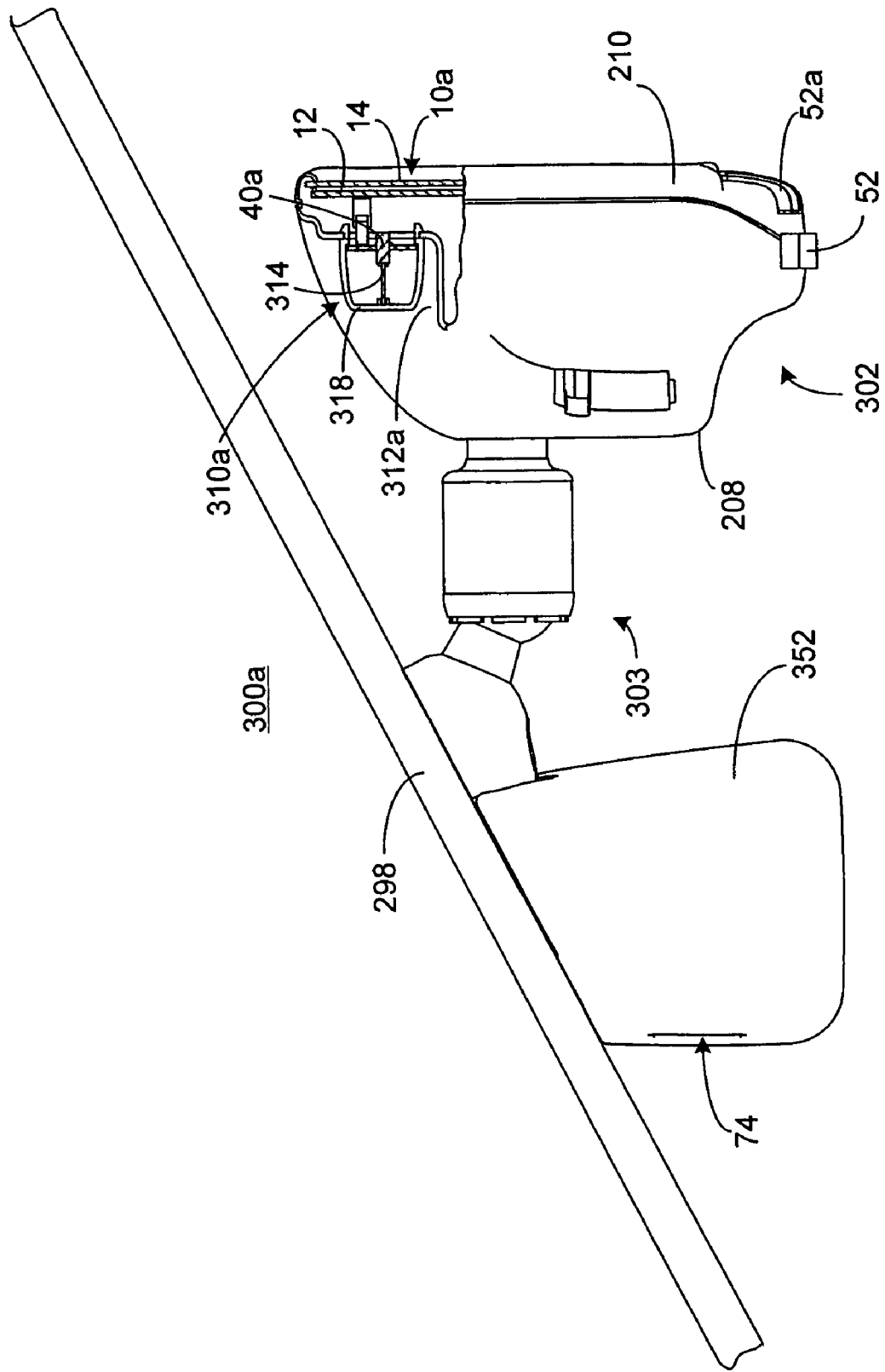

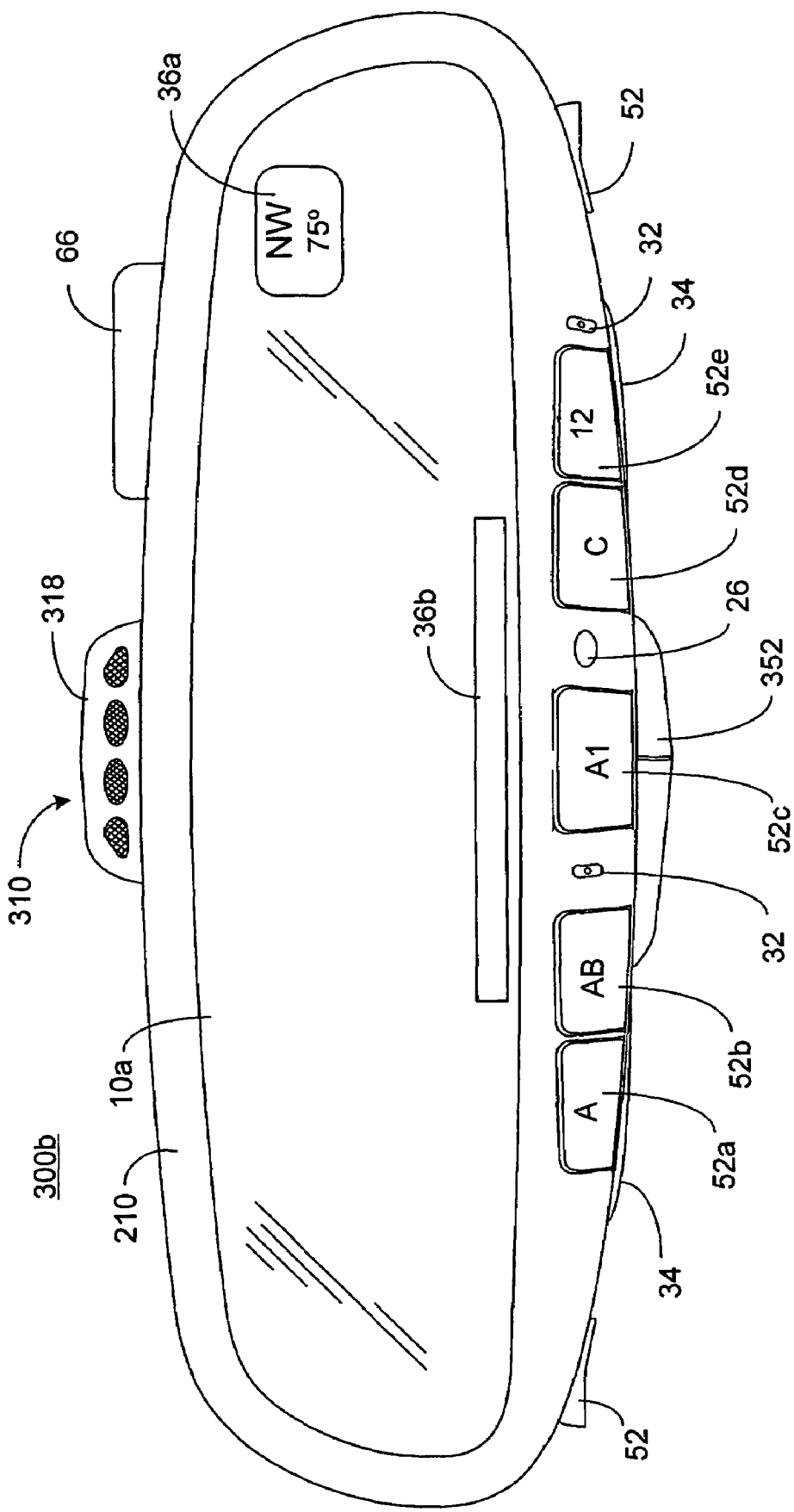

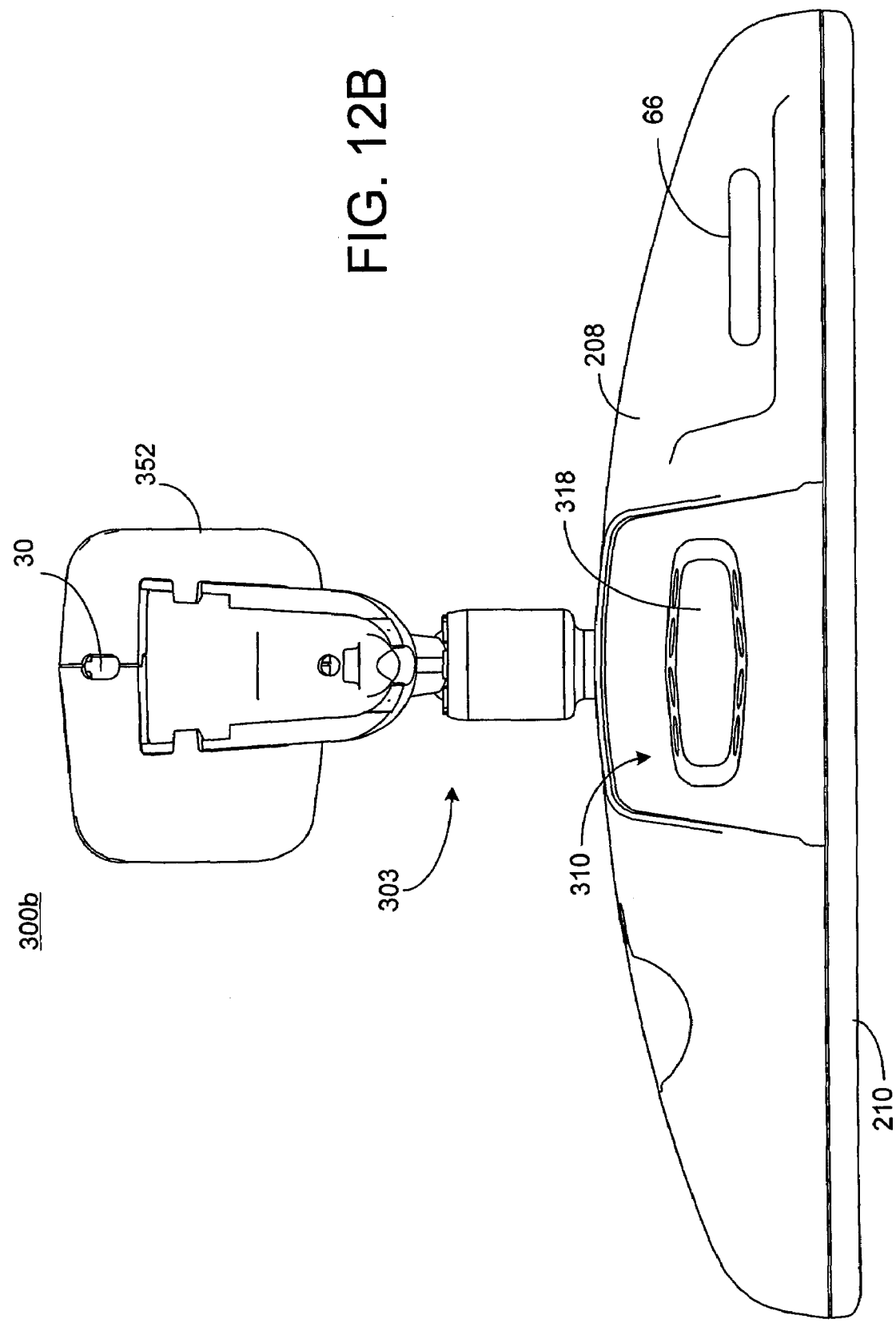

ized mounting relative to the
REARVIEW MIRROR ELEMENT HAVING A CIRCUIT MOUNTED TO THE REAR SURFACE OF THE ELEMENT

BACKGROUND OF THE INVENTION

This invention relates to rearview mirrors for motor vehicles and, more particularly, to improved electrochromic rearview mirror assemblies and subassemblies.

Existing interior and exterior rearview mirror assemblies may both incorporate one or more electronic accessories that utilize a circuit board to support and interconnect the circuit components of the one or more electronic accessories. Placement of the circuit board on the rear of the mirror element or within the housing of the mirror assembly can present certain problems. Specifically, placement of a circuit board within a rearview mirror assembly increases the complexity, component count and cost of the mirror assembly. In addition, it imposes styling constraints due to the need to make the housing larger and deeper to accommodate and support the circuit board. Further, circuit boards require many interconnections to the various electronic components within the assembly. For example, when mounting a display behind the mirror element, a separate daughter circuit board is often required for the display since the display is mounted facing the mirror element while the other components are typically mounted facing the opposite direction on the mother circuit board. Thus, interconnections are required between the mother and daughter boards and the use of two boards increases the volume occupied by the circuit boards within the housing. Similarly, light sensors, pushbuttons and indicator lights are typically mounted so as to face rearward relative to the vehicle sometimes requiring special mounting relative to other components on the circuit board or may require a separate circuit board facing the opposite direction. Likewise, interconnections may be required to microphones mounted on the top or bottom surface of the mirror housing. If the mirror element is an electrochromic mirror element or some other electro-optic variable reflectance mirror element, interconnections to the electrodes of the electro-optic mirror element are also required. Map lights may also require a separate interconnected circuit board. In outside mirrors, interconnections may be required to LEDs or other lights functioning as a turn signal or as an exterior illuminator. All of these interconnections add to the complexity, cost and component count of the mirror assembly.

Because of the need for all of the above-noted interconnections to other components within the mirror housing, it may not be possible to test the circuit boards and the interconnected components until after final assembly. This may result in more of the assembly being scrapped in the event of component failure.

Providing circuit components on circuit boards can result in the inadvertent generation of electromagnetic fields at levels that cause interference to other electronic components within the vehicle, such as the vehicle radio. In addition, circuit components provided on circuit boards may be subject to electromagnetic interference (EMI) from other vehicle accessories thereby resulting in improper operation. In some situations, it may become necessary to utilize additional components or techniques to reduce the EMI levels generated by the circuit components on the circuit board or to improve the immunity of the circuit components to EMI generated by other vehicle accessories.

SUMMARY OF THE INVENTION

According to one embodiment of the present invention, a rearview mirror element is provided for use in a vehicle. The mirror element comprises: a first substrate having a front surface and a rear surface; a reflective coating disposed on a surface of the first substrate; and an electronic circuit component secured to the rear surface of the first substrate.

According to another embodiment, an electrochromic rearview mirror element for use in a vehicle, the electrochromic mirror element comprising: a first substrate having a front surface and a rear surface; a second substrate positioned in front of the first substrate; an electrochromic medium disposed between the first and second substrates; first and second electrically conductive layers disposed between the first and second substrates and electrically coupled to the electrochromic medium; and electrically conductive tracings disposed on the rear surface of the first substrate and electrically coupled to the first and second electrically conductive layers.

These and other features, advantages, and objects of the present invention will be further understood and appreciated by those skilled in the art by reference to the following specification, claims, and appended drawings.

BRIEF DESCRIPTION OF THE DRAWINGS

In the drawings:

FIG. 1 is an elevational view of the rear of a mirror element constructed in accordance with the present invention;

FIG. 6 is a cross-sectional view of a portion of the mirror element of the present invention;

FIG. 7 is a cross-sectional view of a portion of the mirror element of the present invention;

FIG. 9 is an elevational view of the front of a rearview mirror assembly constructed in accordance with the present invention;

FIG. 10A is a cross-sectional view of a portion of the mirror assembly shown in FIG. 9 taken along lines X-X;

FIG. 10B is a cross-sectional view of a portion of the mirror assembly shown in FIG. 9 taken along lines X-X according to another embodiment of the present invention;

FIG. 11A is an elevational side view of a rearview mirror assembly incorporating the mirror element of the present invention;

FIG. 12A is an elevational view of the front of another rearview mirror assembly that may incorporate the mirror element of the present invention;

FIG. 12B is a plan view of the top of the rearview mirror assembly shown in FIG. 12A;

DETAILED DESCRIPTION OF THE PREFERRED EMBODIMENTS

Figure 2A:
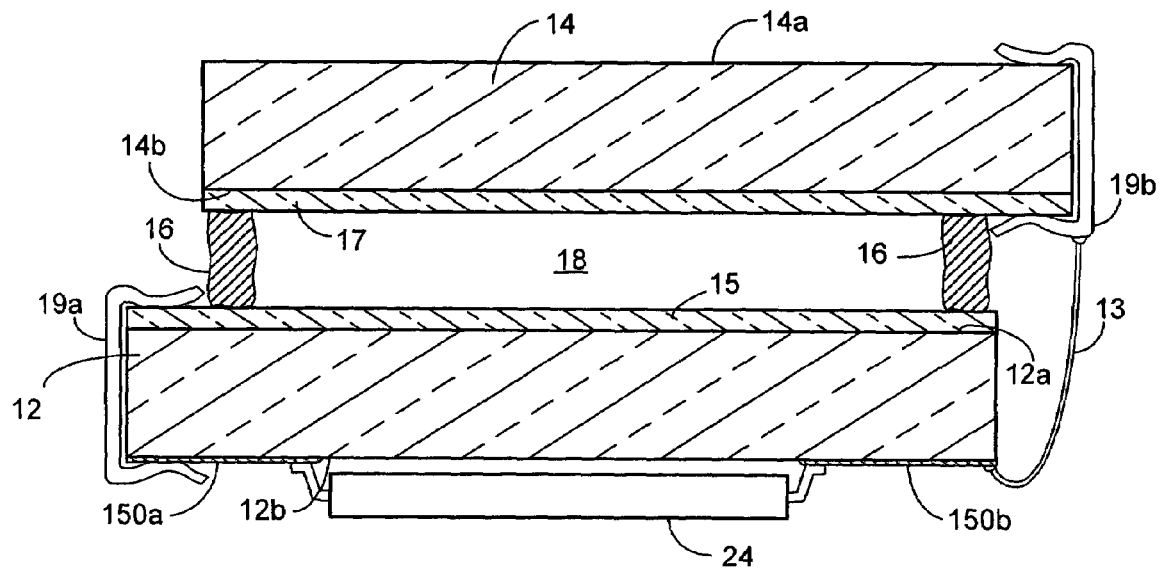
FIG. 2A is a cross-sectional view of a portion of a mirror element constructed in accordance with a first embodiment of the present invention.

A vehicle rearview mirror element 10 according to one embodiment of the present invention is shown in FIGS. 1 and 2A. As shown, mirror element 10 comprises: a first substrate 12 having a front surface 12a and a rear surface 12b; a reflective coating 15 disposed on a surface of first substrate 12; and one or more electronic circuit components (20-116) secured to rear surface 12b of first substrate 12.

Mirror element 10 may be an electrochromic mirror element. As shown in FIG. 2A, an electrochromic mirror element 10a comprises a transparent second substrate 14 positioned in front of first substrate 12. Reflective coating 15 is preferably applied to front surface 12a of first substrate 12. Reflective coating 15 is thus preferably electrically conductive to serve as a first electrode for electrochromic mirror element 10a. Electrochromic mirror element 10a further comprises a transparent conductive layer 17 applied to a rear surface 14b of second substrate 14, which serves as a second electrode.

As also shown in FIG. 2A, electrochromic mirror element 10a further includes a seal 16 extending between first substrate 12 and second substrate 14 to form a sealed chamber in which an electrochromic medium 18 is contained. The electrochromic medium 18 is in electrical contact with transparent conductive layer 17 and reflective coating 15. As known in the art, the reflective coating may be applied to rear surface 12b of first substrate 12, and a second transparent conductive layer may be applied to front surface 12a of first substrate 12 to serve as the first electrode. During operation, electrical current may be passed through the electrochromic medium 18 via the electrodes 15 and 17 thereby causing the electrochromic medium to darken. When the electrochromic medium darkens, the reflectivity of the mirror element is reduced, thereby reducing glare reflected from the mirror towards the eyes of the driver. Additional details of electrochromic mirrors are described further below.

Referring back to FIG. 1, electrically conductive tracings 150 are disposed on rear surface 12b of first substrate 12 to provide electrical interconnections within circuitry 20 to the various electrical components 24-116 mounted on rear surface 12b. As shown in FIGS. 1, 2A, 3, and 4, one such electrical component may be an EC mirror/compass system 21, which includes a drive circuit 24 for an electrochromic mirror element 10a. Drive circuit 24 includes a digital-to-analog converter and various analog components (not shown), which are operated under control of a microprocessor 22 that is responsive to outputs from a glare sensor 26 and an ambient light sensor 28. The drive circuit 24 may be implemented in whole or in part in an application specific integrated circuit (ASIC). An example of such a drive circuit ASIC is disclosed in U.S. Patent Application Publication No. 2003/0234752 A1, the entire disclosure of which is incorporated herein by reference. Conductive tracings 150 may thus include tracings 150a and 150b that interconnect the electrodes 15 and 17 of electrochromic mirror element 10a with drive circuit 24. More specifically, conductive tracing 150a may be electrically coupled to reflective coating 15 and conductive tracing 150b may be electrically coupled to transparent conductive layer 17. A more detailed description of the manner by which such electrical couplings are formed is provided further below.

There are numerous derivative advantages to mounting the electronics directly upon the rear surface of first substrate 12. The resulting fully functional assembly can be fully tested prior to assembly into the outer housing shell. Ultimately, the advantages are primarily in reducing the cost of the product, styling freedoms, tooling cost/complexity reduction for new appearance versions, and ability to add large displays in a cost and implementation effective manner. The cost of the electronic portion of the product is reduced via elimination of the printed circuit board, lower installation labor, fewer interconnection parts like wires and connectors, and inherently better RF properties saving components and other aspects needed to quell RF/EMI problems.

Cost of the outer housing is reduced due to it no longer having to provide the bulk of the strength or costly details to retain the printed circuit board. The very compact and inherently strong assembly also supports a smaller outer housing size. Instead of a two-part case with complex interlocking details, a single housing can be used. The housing is deflected to receive the mirror assembly, the housing being molded to the final desired shape including an internal nest for the mirror assembly. Then, secondary heat is used to allow the mirror to enter the housing. Alternatively, the housing could be molded from an elastomeric material.

An alternative is to resize the housing using heat and pressure to a size large enough to accept the mirror assembly, then heat is applied to allow the plastic housing to return to its molded size, capturing the mirror. This is the same action as is done in "heat shrink tubing."

Figure 3:
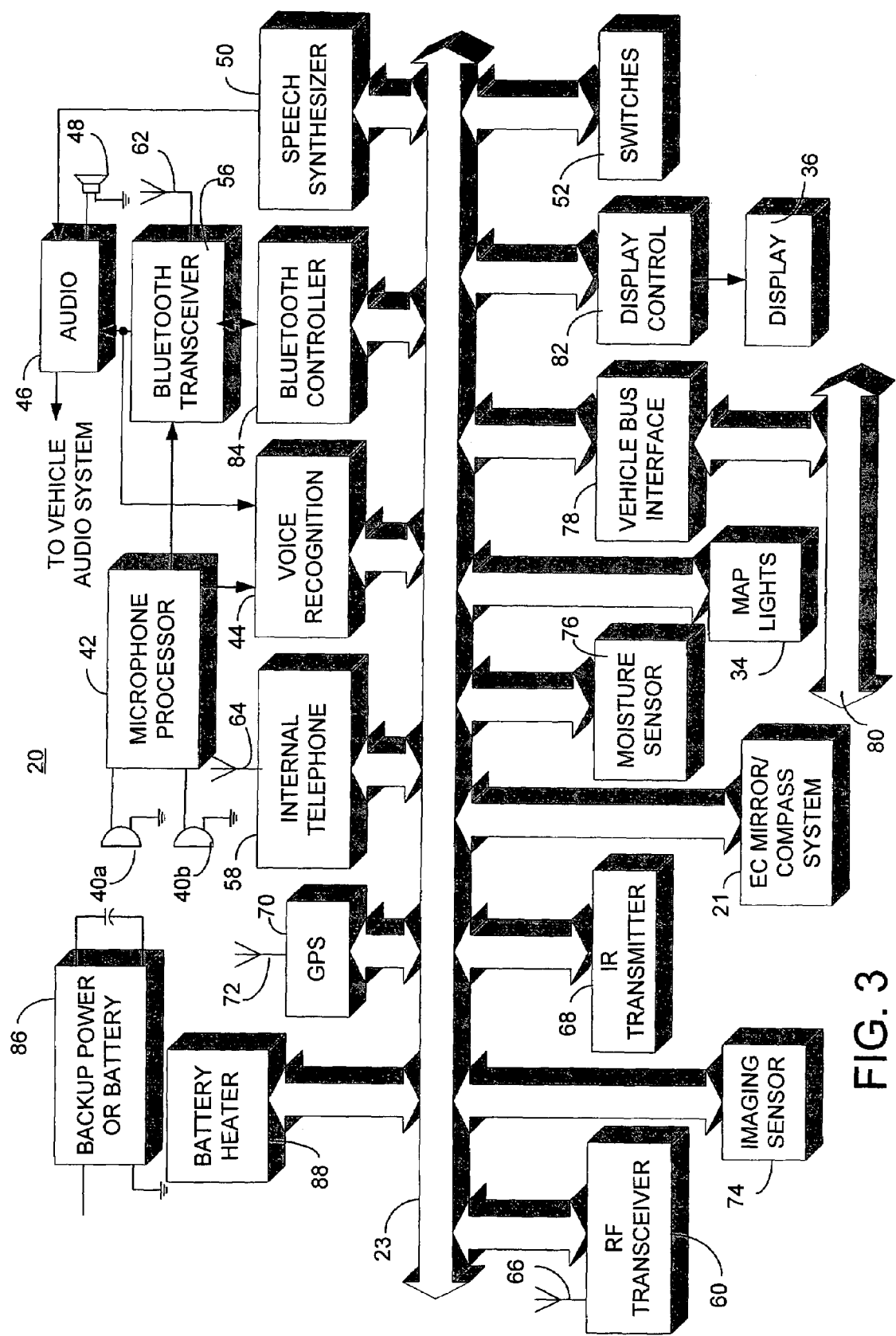
FIG. 3 is an electrical circuit diagram in block form illustrating the electrical components that may be provided on the rear surface of the mirror element of the present invention.
Figure 4:
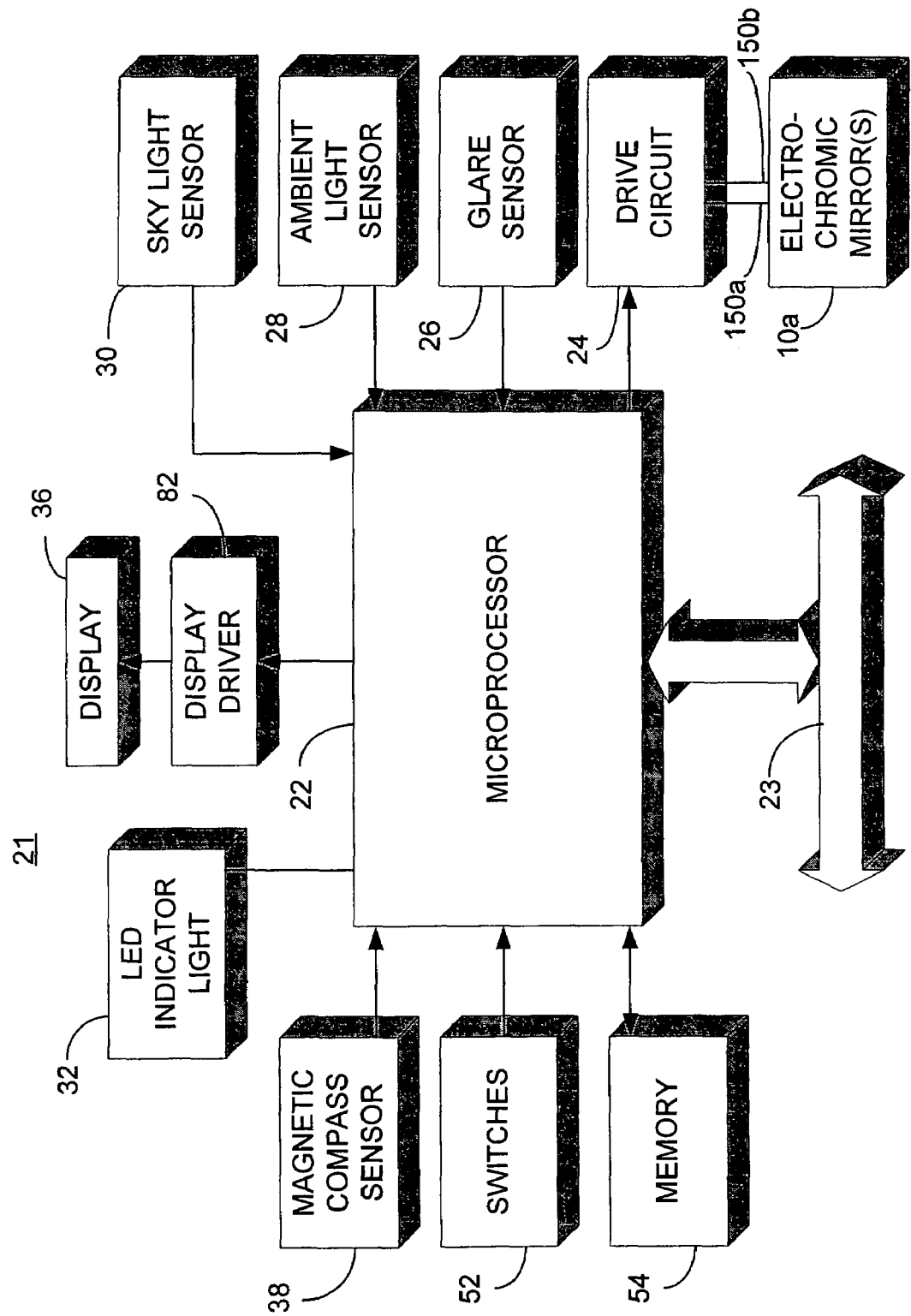
FIG. 4 is an electrical circuit diagram in block form showing the electrical components of an electrochromic mirror/compass system, which may be provided on the rear surface of a mirror element constructed in accordance with the present invention.
Figure 5:
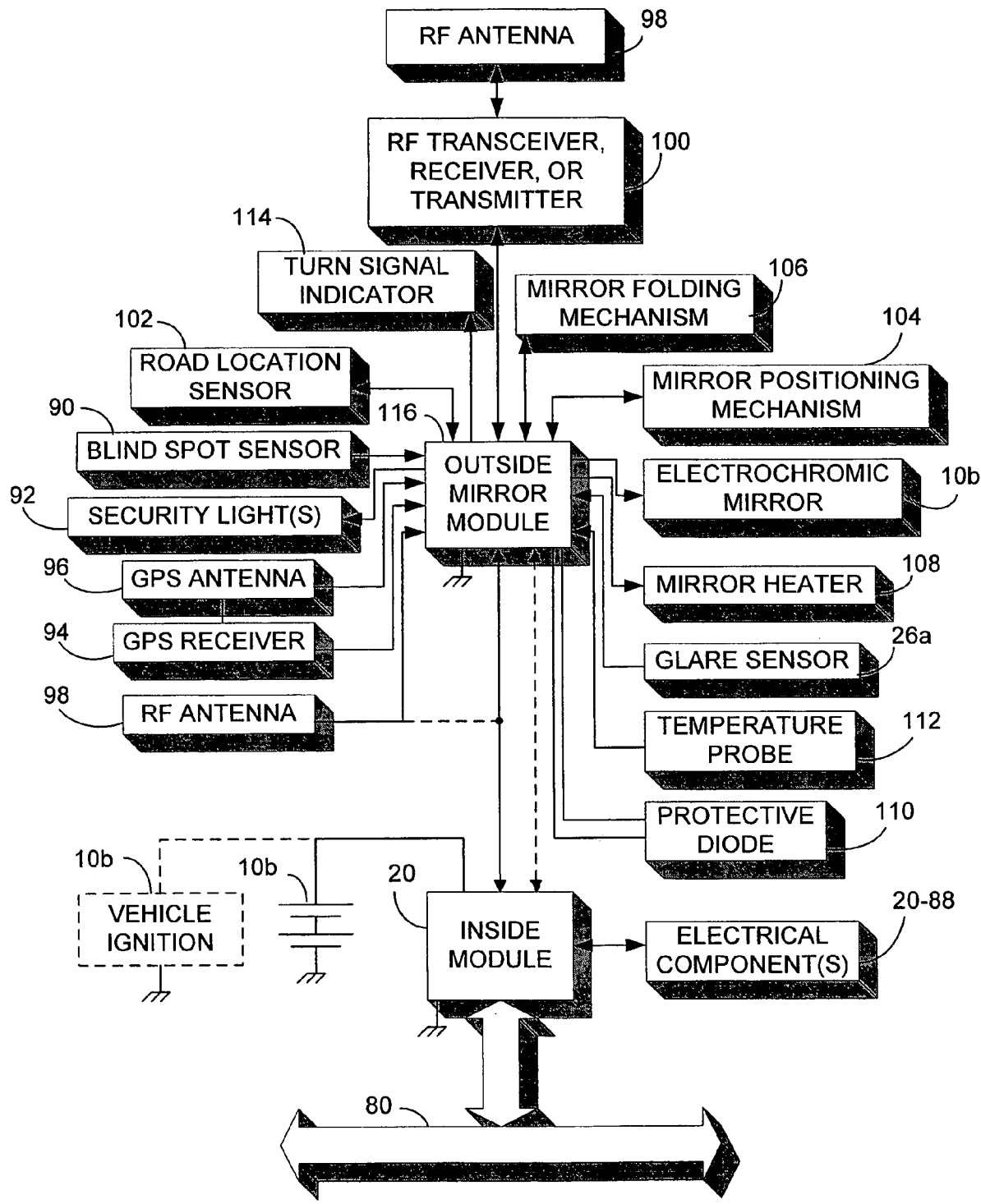
FIG. 5 is an electrical circuit diagram in block form illustrating additional electrical components that may be mounted on a mirror element constructed in accordance with the present invention.

As shown in FIGS. 1, 3, and 4, the electronic components mounted to rear surface 12b of first substrate 12 may include any one or more of the following: drive circuit 24; one or more light sources (such as an LED indicator light 32 or map lamps 34); one or more light sensors (such as a sky light sensor 30, an ambient sensor 28, or a glare sensor 26); a microprocessor 22; one or more display devices 36; a compass sensor circuit 38; a microphone transducer(s) 40a and 40b; a microphone processor or a digital signal processor (DSP) circuit 42; a voice recognition circuit 44; an audio amplifier 46; one or more speakers 48; a speech synthesizer 50; user actuated switches 52; memory circuits 54; a radio frequency (RF) transmitter, receiver, or transceiver (such as a BLUETOOTH™ transceiver 56 or a cellular telephone transceiver 58, or a trainable garage door opener transmitter/remote keyless entry (RKE) receiver/tire pressure sensor receiver/electronic toll collection (ETC) transceiver 60); an RF antenna 62, 64, 66; an infrared (1R) transmitter, receiver or transceiver 68; a microwave receiver 70 (such as a global positioning system (GPS) receiver or a satellite radio receiver); a microwave antenna 72; an imaging sensor 74; a moisture sensor 76; a vehicle bus interface 78 coupled to a vehicle bus 80; a display driver circuit 82; a BLUETOOTH™ controller 84; a power supply 86 with an optional back-up battery; and a battery heater 88. As shown in FIG. 5, the electronic components may also include any one or more of the following: a blind spot sensor 90; security lights 92; a GPS receiver 94; a GPS antenna 96; an RF antenna 98; an RF transmitter, receiver, or transceiver 100; a road location (or lane detection) sensor 102; a mirror positioning mechanism 104; a mirror power folding mechanism 106; a mirror heater 108; an external glare sensor 26a; one or more diodes 110, which may be connected to one of the first and second electrically conductive layers of an electrochromic element 10a for protection from reverse polarity connection to a power supply; a temperature probe 112; a turn signal indicator 114; and an outside mirror control module 116. The electrical components shown in FIG. 5 are more typically included in an outside rearview mirror assembly. Details of some of these electrical components are described further below.

First substrate 12 may be opaque, but is preferably transparent or transfective if a display or light sources are positioned to project light through the mirror element, or if light sensors are positioned to sense light passing through the mirror element. Preferably, first substrate 12 is made of glass. Providing electronics on glass is prevalent in the field of liquid crystal displays where on-glass electronics avoid the massive numbers of connections required for each pixel. Schott Glass is among those companies selling glass for on-glass electronics. Such glass includes layers of very thin glass from stacks, which yields very high densities. This type of glass is preferable because of its high relative heat transfer, dielectric properties, and its transparency.

Referring back to FIG. 2A, an embodiment of an electrochromic mirror element 10a is shown. FIG. 2A shows a cross-sectional view of mirror element 10a, which includes transparent second substrate 14 having a front surface 14a and a rear surface 14b, and first substrate 12 having a front surface 12a and a rear surface 12b. The two substrates may be joined by a seal 16. Seal 16 serves to provide a chamber between elements 12 and 14 in which electrochromic medium 18 is contained in contact with both electrodes 15 and 17. Electrochromic medium 18 includes electrochromic anodic and cathodic materials that can be grouped into the following categories:

(i) Single layer—the electrochromic medium is a single layer of material which may include small inhomogeneous regions and includes solution-phase devices where a material is contained in solution in the ionically conducting electrolyte and remains in solution in the electrolyte when electrochemically oxidized or reduced. U.S. Pat. No. 6,193,912 entitled "NEAR INFRARED-ABSORBING ELECTROCHROMIC COMPOUNDS AND DEVICES COMPRISING SAME"; U.S. Pat. No. 6,188,505 entitled "COLOR STABILIZED ELECTROCHROMIC DEVICES"; U.S. Pat. No. 6,262,832 entitled "ANODIC ELECTROCHROMIC MATERIAL HAVING A SOLUBLIZING MOIETY"; U.S. Pat. No. 6,137,620 entitled "ELECTROCHROMIC MEDIA WITH CONCENTRATION ENHANCED STABILITY PROCESS FOR PREPARATION THEREOF AND USE IN ELECTROCHROMIC DEVICE"; U.S. Pat. No. 6,195,192 entitled "ELECTROCHROMIC MATERIALS WITH ENHANCED ULTRAVIOLET STABILITY"; U.S. Pat. No. 6,392,783, entitled "SUBSTITUTED METALLOCENES FOR USE AS AN ANODIC ELECTROCHROMIC MATERIAL AND ELECTROCHROMIC MEDIA AND DEVICES COMPRISING SAME"; and U.S. Pat. No. 6,249,369 entitled "COUPLED ELECTROCHROMIC COMPOUNDS WITH PHOTOSTABLE DICATION OXIDATION STATES" disclose anodic and cathodic materials that may be used in a single layer electrochromic medium, the entire disclosures of which are incorporated herein by reference. Solution-phase electroactive materials may be contained in the continuous solution phase of a cross-linked polymer matrix in accordance with the teachings of U.S. Pat. No. 5,928,572, entitled "IMPROVED ELECTROCHROMIC LAYER AND DEVICES COMPRISING SAME" or International Patent Application No. PCT/US98/05570 entitled "ELECTROCHROMIC POLYMERIC SOLID FILMS, MANUFACTURING ELECTROCHROMIC DEVICES USING SUCH SOLID FILMS, AND PROCESSES FOR MAKING SUCH SOLID FILMS AND DEVICES," the entire disclosures of which are incorporated herein by reference.

At least three electroactive materials, at least two of which are electrochromic, can be combined to give a pre-selected color as described in U.S. Pat. No. 6,020,987 entitled "ELECTROCHROMIC MEDIUM CAPABLE OF PRODUCING A PRE-SELECTED COLOR," the entire disclosure of which is incorporated herein by reference. This ability to select the color of the electrochromic medium is particularly advantageous when designing architectural windows.

The anodic and cathodic materials can be combined or linked by a bridging unit as described in International Application No. PCT/WO97/EP498 entitled "ELECTROCHROMIC SYSTEM," the entire disclosure of which is incorporated herein by reference. It is also possible to link anodic materials or cathodic materials by similar methods. The concepts described in these applications can further be combined to yield a variety of electrochromic materials that are linked.

Additionally, a single layer medium includes the medium where the anodic and cathodic materials can be incorporated into the polymer matrix as described in International Application No. PCT/WO98/EP3862 entitled "ELECTROCHROMIC POLYMER SYSTEM," U.S. Pat. No. 6,002,511, or International Patent Application No. PCT/US98/05570 entitled "ELECTROCHROMIC POLYMERIC SOLID FILMS, MANUFACTURING ELECTROCHROMIC DEVICES USING SUCH SOLID FILMS, AND PROCESSES FOR MAKING SUCH SOLID FILMS AND DEVICES," the entire disclosures of which are incorporated herein by reference.

Also included is a medium where one or more materials in the medium undergoes a change in phase during the operation of the device, for example, a deposition system where a material contained in solution in the ionically conducting electrolyte which forms a layer or partial layer on the electronically conducting electrode when electrochemically oxidized or reduced.

(ii) Multilayer—the medium is made up in layers and includes at least one material attached directly to an electronically conducting electrode or confined in close proximity thereto which remains attached or confined when electrochemically oxidized or reduced. Examples of this type of electrochromic medium are the metal oxide films, such as tungsten oxide, iridium oxide, nickel oxide, and vanadium oxide. A medium, which contains one or more organic electrochromic layers, such as polythiophene, polyaniline, or polypyrrole attached to the electrode, would also be considered a multilayer medium.

In addition, the electrochromic medium may also contain other materials, such as light absorbers, light stabilizers, thermal stabilizers, antioxidants, thickeners, or viscosity modifiers.

It may be desirable to incorporate a gel into the electrochromic device as disclosed in commonly assigned U.S. Pat. No. 5,940,201 entitled "AN ELECTROCHROMIC MIRROR WITH TWO THIN GLASS ELEMENTS AND A GELLED ELECTROCHROMIC MEDIUM," filed on Apr. 2, 1997. The entire disclosure of this U.S. patent is incorporated herein by reference.

First and second substrates 12 and 14 may be any material which is transparent and has sufficient strength to be able to operate in the environmental conditions to which the device will be exposed, e.g., varying temperatures and pressures commonly found in the automotive environment. Substrates may comprise any type of borosilicate glass, soda lime glass, float glass, or any other material, such as, for example, MYLAR®; polyvinylidene chloride; polyvinylidene halides, such as polyvinylidene fluoride; cyclic olefin copolymers like Topas® available from Ticona, LLC of Summitt, N.J., that is transparent in the visible region of the electromagnetic spectrum; and other polymers. Front substrate 14 is preferably a sheet of glass. The rear substrate 12 should meet the operational conditions outlined above, except that it does not need to be transparent in all applications, and therefore may comprise polymers, metals, glass, ceramics, and preferably is a sheet of glass.

Additionally, substrates 12 and 14 may be treated or coated as is described in U.S. Pat. No. 6,239,898 entitled "ELECTROCHROMIC STRUCTURES," U.S. Pat. No. 6,193,378 entitled "AN ELECTROCHROMIC DEVICE HAVING A SELF-CLEANING HYDROPHILIC COATING," and U.S. patent application Ser. No. 09/602,919 entitled "AN ELECTRO-OPTIC DEVICE HAVING A SELF-CLEANING HYDROPHILIC COATING," filed on Jun. 23, 2000, the entire disclosures of which are incorporated herein by reference. Other treatments, such as anti-reflectance coatings, hydrophilic coatings, low-E coatings, and UV-blocking layers are also envisioned. Such coatings may also be applied to substrates 12 and 14 in this and other embodiments.

It is desirable in the construction of outside rearview mirrors to incorporate thinner glass in order to decrease the overall weight of the mirror so that the mechanisms used to manipulate the orientation of the mirror are not overloaded. Decreasing the weight of the device also improves the dynamic stability of the mirror assembly when exposed to vibrations. Heretofore, no electrochromic mirrors incorporating a solution-phase electrochromic medium and two thin glass elements have been commercially available, because thin glass suffers from being flexible and is prone to warpage or breakage, especially when exposed to extreme environments. This problem is substantially improved by using an improved electrochromic device incorporating two thin glass elements having an improved gel material. This improved device is disclosed in commonly assigned U.S. Pat. No. 5,940,201 entitled "AN ELECTROCHROMIC MIRROR WITH TWO THIN GLASS ELEMENTS AND A GELLED ELECTROCHROMIC MEDIUM." The entire disclosure of this patent is incorporated herein by reference. The addition of the combined reflector/electrode onto the third surface 12a of the device further helps remove any residual double imaging resulting from the two glass elements being out of parallel.

Transparent conductive material 17 may be any material which bonds well to front substrate 14, is resistant to corrosion to any materials within the electrochromic device, resistant to corrosion by the atmosphere, has minimal diffuse or specular reflectance, high light transmission, near neutral coloration, and good electrical conductance. Transparent conductive material 17 may be fluorine-doped tin oxide, doped zinc oxide, zinc-doped indium oxide, indium tin oxide (ITO), ITO/metal/ITO (IMI) as disclosed in "Transparent Conductive Multilayer-Systems for FPD Applications," by J. Stollenwerk, B. Ocker, K. H. Kretschmer of LEYBOLD AG, Alzenau, Germany; the materials described in above-referenced U.S. Pat. No. 5,202,787, such as TEC 20 or TEC 15, available from Libbey Owens-Ford Co. of Toledo, Ohio; or other transparent conductors. Generally, the conductance of transparent conductive material 17 will depend on its thickness and composition. IMI generally has superior conductivity compared with the other materials. IMI is, however, known to undergo more rapid environmental degradation and suffer from interlayer delamination. The thickness of the various layers in the IMI structure may vary, but generally the thickness of the first ITO layer ranges from about 10 Å to about 200 Å, the metal ranges from about 10 Å to about 200 Å, and the second layer of ITO ranges from about 10 Å to about 200 Å. If desired, an optional layer or layers of a color suppression material may be deposited between transparent conductive material 17 and the rear surface 14b to suppress the reflection of any unwanted portions of the electromagnetic spectrum.

In accordance with the present invention, a combination reflector/electrode 15 is disposed on front surface 12a of rear substrate 12. Reflector/electrode 15 comprises at least one layer of a reflective material which serves as a mirror reflectance layer and also forms an integral electrode in contact with and in a chemically and electrochemically stable relationship with any constituents in an electrochromic medium. As stated above, the conventional method of building electrochromic devices was to incorporate a transparent conductive material on the third surface 12a as an electrode, and place a reflector on the fourth surface 12b.

Reflector/electrode 15 may be entirely reflective or may be partially reflective and partially transmissive (i.e., transflective). If the reflector/electrode 15 is entirely reflective, a window 170 may need to be formed in front of any displays, LEDS, or sensors as shown in FIGS. 6, 9, 15, and 18. The window 170 may be formed only in some or all of the reflective layer(s) of the reflector/electrode 15 such that a continuous layer of a transparent conductive material may overlie the display. Alternatively, a window may be formed while retaining a number of strips or other patterns of the reflective layer in front of the display or sensor as disclosed in U.S. Pat. No. 6,111,683, the entire disclosure of which is incorporated herein by reference. The reflector/electrode 15 may alternatively be transflective, at least in the region in front of the display, LED or sensor or may be transflective across the entire mirror surface. Examples of suitable transflective and reflective coatings are disclosed in U.S. Pat. Nos. 6,356,376 and 6,700,692, the entire disclosures of which are incorporated herein by reference. The reflector/electrode may be tied to an AC or DC ground to provide a ground plane for the circuitry attached to the glass. This ground plane can reduce RF emissions and RF susceptibility from the circuitry mounted on the mirror.

In the particular embodiment shown in FIG. 2A, seal 16 may be any material that is capable of adhesively bonding to the coatings on the inner surfaces of substrates 12 and 14 to seal the perimeter, such that electrochromic material 18 does not leak from the chamber defined between the transparent substrates. The seal preferably has good adhesion to glass, metals, and metal oxides; preferably has low permeabilities for oxygen, moisture vapor, and other detrimental vapors and gasses; and must not interact with or poison the electrochromic material it is meant to contain and protect. Examples of suitable seal materials are disclosed in U.S. Pat. Nos. 5,790,298; 6,157,480; and 6,195,193, the entire disclosures of which are incorporated herein by reference.

As illustrated in FIG. 2A, electrochromic element 10a further includes a pair of electrical bus clips 19a and 19b that are respectively clipped about the perimeter of first and second substrates 12 and 14 in such a manner as to physically and electrically contact electrodes 15 and 17. In this embodiment, the front and rear substrates 12 and 14 are offset so as to accommodate bus clips 19a and 19b. In this embodiment, the seal 16 is made of a nonconductive epoxy. On rear surface 12b, conductive tracing 150a extends under the bus clip 19a that is coupled to reflective electrode 15 such that clip 19a electrically couples tracing 150a and electrode 15. Tracing 150a is coupled to a terminal of drive circuit 24, which is mounted to rear surface 12b. Conductive tracing 150b extends from a second terminal of drive circuit 24 and is electrically coupled to the second clip 19b via a wire 13. Second clip 19b and wire 13 thus couple tracing 150b to electrode 17. Bus clips 19a and 19b thus enable electrical current to flow between drive circuit 24 through first and second electrodes 15 and 17 and the electrochromic medium 18 contained in the chamber therebetween. In this manner, the light transmittance of electrochromic element 10a may be varied in response to electrical control of drive circuit 24. Bus clips 19a and 19b may be made of any known construction and known materials. One possible construction for bus clips 19a and 19b is disclosed in U.S. Pat. No. 6,064,509 entitled "CLIP FOR USE WITH TRANSPARENT CONDUCTIVE ELECTRODES IN ELECTROCHROMIC DEVICES" filed on Aug. 22, 1997, by Tonar et al., the disclosure of which is incorporated herein by reference.

As described above, the bus clips are used as a means of uniformly transferring electricity from lead wires or tracings to the conductive coatings that have been previously deposited on the substrates. This can also be accomplished by the use of a metal-doped paint or coating (such as silver, copper, etc.), metal-doped epoxy or resin, or by the use of conductive adhesive tapes, such as those available from the 3M Corporation. Examples of these tapes are 3M's Electrically Conductive Adhesive Transfer Tape #9703 and #9713. Additionally, metal foil or exposed wire may be used. Yet another alternative is the approach shown in FIG. 2B and described below.

Figure 2B:
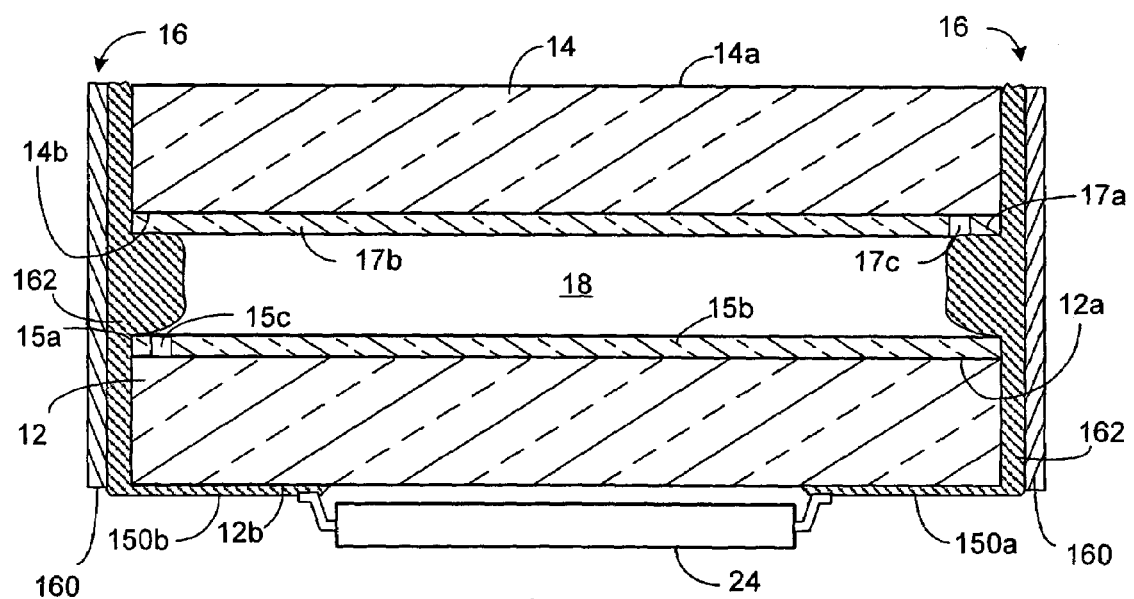
FIG. 2B is a cross-sectional view of a portion of a mirror element constructed in accordance with a second embodiment of the present invention.

FIG. 2B shows a second embodiment, which eliminates the bus clips 19a and 19b and wire 13. Instead, seal 16 is made of an electrically conductive material 162 and is provided along the edge of the electrochromic element 10a. As shown, a conductive seal material 162 is provided that not only seals the chamber between substrates, but also provides an electrical connection to the electrodes 15 and 17. The conductive seal material may be applied to the rear surface 12b of substrate 12 as well to provide tracings 150a and 150b that are coupled to terminals of drive circuit 24, which is mounted to rear surface 12b. The conductive seal material tracings 150a and 150b may serve to bond drive circuit 24 to rear surface 12b. Additional adhesive material may be used if needed. A metal foil 160 is provided around the perimeter edge of the element 10a to protect the seal material 162 and provide additional conductivity. If the tracings 150a and 150b are made of a material different from seal material 162, such as a conductive ink, either the seal material 162 or the foil 160 may be in contact with tracings 150a and 150b to provide a conductive path. To prevent shorting between electrodes 15 and 17, portions 15c and 17c of the electrodes may be etched to electrically isolate the operational portions 15b and 17b of the electrodes from non-operational portions 15a and 17a that contact the portion of seal material 162 that also contacts the operational portion of the other electrode.

Also, in this embodiment, the substrates 12 and 14 are not offset from one another. Eliminating the offset of the substrates is advantageous in that it minimizes the extent to which a bezel may need to be employed to cover the offset and any bus clips. The electrochromic cell design shown in FIG. 2B as well as many other designs that may be used with the present invention are further described in U.S. Patent Application Publication No. 2004/0061920, entitled "ELECTROCHROMIC DEVICES HAVING NO POSITIONAL OFFSET BETWEEN SUBSTRATES," filed on Sep. 30, 2002, the entire disclosure of which is incorporated herein by reference.

As yet another method of making electrical connection to electrode 17, a notched area in rear glass substrate 12 can be provided in which an electrically conductive material is dispensed that extends between the second electrode layer 17 and the rear surface 12b where the electronics are located. The electrical conductivity of this bead can also be enhanced by a wire or the bead may be replaced by a wire.

Figure 2C:
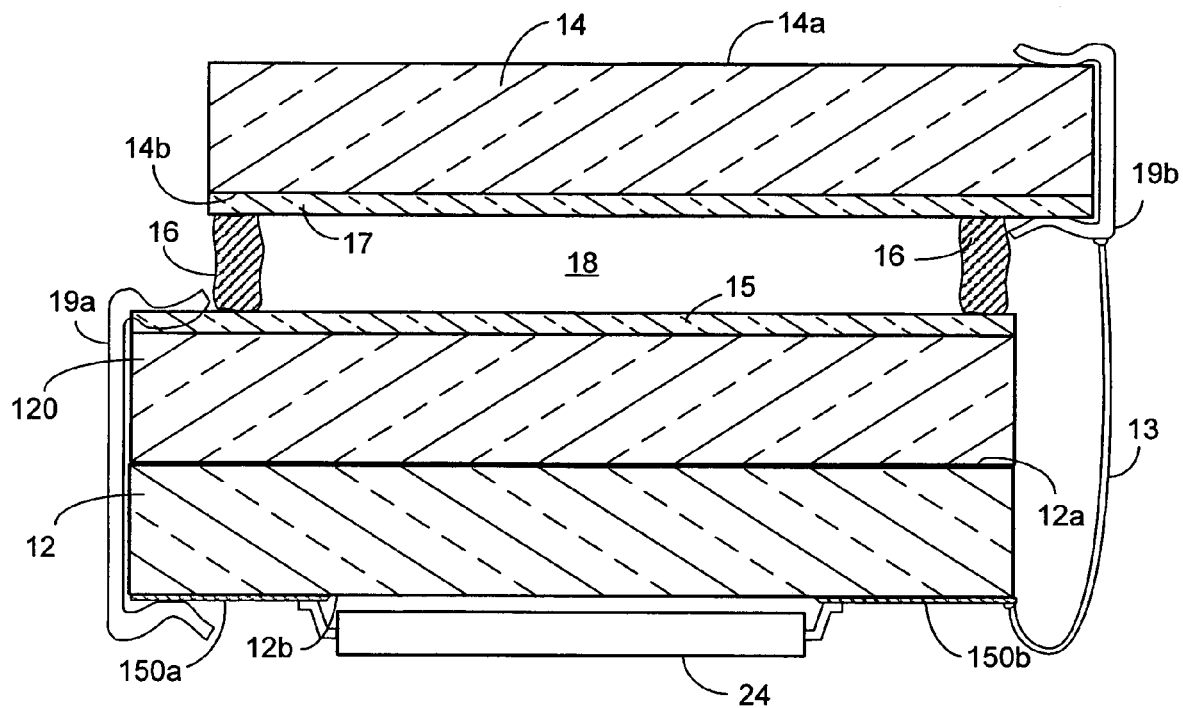
FIG. 2C is a cross-sectional view of a portion of a mirror element constructed in accordance with a third embodiment of the present invention.

It should be noted that first substrate 12 may be a separate glass substrate from that used as the rear substrate of the mirror element. In other words, with respect to an electrochromic mirror element, second substrate 14 may be secured to a third substrate 120 (FIG. 2C) to form a sealed chamber therebetween for containing an electrochromic medium. In this embodiment, first substrate 12 may be separately formed with its associated electronic components and tracings provided on its rear surface and subsequently bonded to the rear surface of the third substrate 120. This embodiment offers the advantages of providing a surface that is more likely to have a uniform flatness and thereby provide better uniformity of the traces. In addition, this embodiment may utilize a cheaper form of glass for either first substrate 12 or third substrate 120. Such a separate substrate would adhere well to the rear substrate of the mirror since it would be possible to select an adhesive that bonds well to glass to bond both elements together. Further, such a construction would enhance the thermal conductivity of the mirror element as a whole by spreading the heat out without creating hot spots on the mirror. In addition, low current components may be used.

The electrically conductive tracings 150 may be applied to rear surface 12b using a number of different techniques. According to one embodiment, a mask is applied to rear surface 12b and then the masked substrate is coated using a sputtering process. First substrate 12 can be masked by various means, including contact printing prior to sputtering a conductive material onto the rear surface 12b to form conductive traces 150. By using "tube coaters," masking may be far more practical than in conventional coaters. The circuit should be carefully designed to fit the limitations of masking. The mask blocks areas on rear surface 12b from receiving metal so the circuit layout and tracings should be designed to avoid islands of uncoated areas as such islands cannot be readily supported in a single mask. The degree of detail in the circuit tracings should also be coarse enough to allow use of a mask. The exact level of possible detail is determined by the thickness of the mask, the flatness of the mask against the glass, and the means used to clean the mask of deposited metal.

Another possible method of applying a sputtering-based metal circuit is to apply metal to the entire rear glass surface and then remove excess metal by laser or chemical etching to form the isolated circuit tracings. Preferably, the applied metal has three layers. A first layer is made of chromium to obtain good bonding to the rear surface of first glass substrate 12. A top layer is made of a material exhibiting good electrical conductive properties like copper, silver, or gold. The center layer preferably provides a good bond to both chromium and the top conductive layer. In this three-layer construction, layers of chromium, nickel, and copper are the most preferred combination of materials. Thus, the method could include the steps of depositing a layer of chromium (or layers of chromium and the next material layer), then etching the layer(s) to define the tracings, and last electroless plating of the etched structure with copper or the like.

It is desirable for the metal coating to be thin enough to limit conduction and to introduce some resistance. The resulting impedance tends to decouple the larger conductive regions thereby reducing the emission of EMI. Relatively few circuits in an electrochromic mirror assembly carry significant currents so there is no functional penalty for introducing such resistance and the discrete resistors normally needed to decouple can be reduced or eliminated.

In addition to forming the circuit traces via laser, chemical etching in combination with photoresist techniques can be used as is done in the current printed circuit board industry. Every means currently employed in printed circuit board manufacture can be applied to glass with glass replacing the board.

The trace pattern can also be created by electroless plating, replacing or augmenting the above-described sputtered coating. Using electroless plating techniques, silver, copper or other conductive metals may be deposited onto first substrate 12. In this method, an electroless metal solution is applied directly to rear surface 12b by inkjet printing or by other means to form a conductive trace. The process involves the reduction of a complexed metal using a reducing agent such as aldehyde and hypophosphite to form a conductive metal trace. Copper can be electroless plated onto first substrate 12 by first adding a catalytic seed layer, like palladium, which is deposited on the surface in extremely small amounts by inkjet printing or other methods. This seed layer is then exposed to a complexed metal salt material and a reducing agent. The metallic material is only deposited in regions where there is a seed layer.

Yet another way to create a circuit trace pattern is to apply a conductive adhesive directly to the glass. This can be done by screen printing, micro volume dispensing or regular needle dispensing. When this approach is used to form the traces, the same adhesive application can be used to attach the components.

Another technique is to inkjet print a conductive material like copper, nickel, cobalt, silver, gold, platinum, and other metals onto substrate 12. A preferred inkjet printing technique is the technique (also called Conductive Inkjet Technology) developed by a joint venture between Xennia Technology Limited, Lumen House, Lumen Road, Royston, Hertfordshire SG8 7AG, United Kingdom and Carclo plc, Ploughland House, P.O. Box 14, 62 George Street, Wakefield, WF1 1ZF United Kingdom. This joint venture is known as Conductive InkJet Technology Limited, Ploughland House, P.O. Box 14, 62 George Street, Wakefield, West Yorkshire, WF1 1ZF, United Kingdom.

Another method that can be used is to make traces of copper, nickel, or other conductive material(s) as described in a paper by Y. Tu, G. H. Chapman, and M. V. Sarunic "Bimetallic Thermal Activated films for Microfabrication, Photomasks and Data Storage," Proceedings SPIE Photonics West, Laser Applications in Microelectronics and Optoelectronics Applications, Vol. 4637, pages 330-340. In this work, a bimetallic thermal resist of Bi/In was coated on a substrate like glass, and then the thermal resist was directly written on with a laser. Where exposed, an alloyed resist is formed. The resist is developed, leaving only the Bi/In alloy at the surface of the substrate where it was exposed by the laser. Since this alloy is conductive, other conductive metals can be directly electroplated onto this metallic alloy to form metal traces.

Another technique to apply traces 150 is to use inkjet printing of nanoparticles as described in the Materials Research Society Symposium Proceedings Vol. 769H8.3.1.

Another technique is to use MOCVD (metallo-organic chemical vapor deposition) processes or inkjet printing to apply a liquid precursor, such as hexafluoroacetylacetonate Cu(I) trimethylvinyl silane (or triethoxyvinylsilane), which upon heating or other treatment decomposes to yield metal traces, as described in *Applied Physics Letters* 68(7) 1996; NREL conference paper NREL/CP-520-31020.

Another technique for applying tracings 150 is the use of a solid-phase silver precursor, Silver(I) hexafluoroacetonylacetonate complexed to an alkene (such as cyclooctadiene (COD) or trimethyl vinyl silane (tmvs)). The precursor is dissolved in a solvent (e.g., terpineol) and patterned by inkjet printing or by other means. Thermal decomposition of the deposited precursor yields metallic silver and a volatile by-product. This technique is described in *Organometallics* 1985, 4,830-835; NREL conference paper NREL/CP-520-31020.

Tracings 150 may also be applied by deposition of a mixture of a liquid MOCVD precursor containing metal nanoparticles. The metal nanoparticles are "glued" together by the metal derived from the decomposition of the MOCVD precursor to form conductive traces. An example of this technique is described in NREL conference paper NREL/CP-520-31020.

Yet another method for forming traces 150 is by laser direct-write (LDW). In general, LDW is a process of creating a pattern of selective conductive materials on a substrate by the transfer of the conductive material with a steady pulsed laser beam from a UV-transparent ribbon support to a receiving substrate.

Still another method for forming tracings 150 is by photoreduction of a metal salt. In this method, a metal salt solution is applied to the rear surface of first substrate 12, and then is developed by an illumination source that photoreduces the metal salt to a conductive material. A pattern of the conductive material could be formed by either selectively patterning the conductive material with a laser or by first masking the surface followed by the photoreduction. Also, a metal salt solution could be directly patterned on the surface of a substrate by inkjet printing or by other means followed by the photo illumination.

Another method for forming tracings 150 is to use Laser Chemical Vapor Deposition (LCVD). An example of this method is described in Y. Morishige and S. Kishida "Thick Gold-Film Deposition by High-Repetition Visible Pulsed-Laser Chemical Vapor Deposition," Applied Physics A, 59, 395-399, 1994.

As shown in FIGS. 1 and 7, when tracings may have to cross paths, it may be appropriate to use a jumper wire 180, which is secured to opposite ends of an interrupted tracing that allows the perpendicular tracing to pass while retaining its electrical isolation from the interrupted tracing 150.

After the trace pattern has been formed on rear surface 12b, the electrical components are then attached. Component attachment can be via solder, essentially as is done in conventional printed circuit board assemblies. When the mirror element is a preassembled electrochromic element, there is an added concern that heating the electrochromic element to soldering temperatures may harm the electrochromic medium. This concern can be eliminated by attaching the components prior to filling the electrochromic element with the electrochromic medium. Elevating the temperature of the electrochromic element for the time needed to solder does not harm the epoxy seal 16 and may beneficially reduce contamination by fully curing the epoxy seal.

Because a number of glass reject causes are not directly detectable when the electrochromic element has not yet been filled with an electrochromic medium, it may be desirable to carefully test the competed assembly in order to reduce glass scrap as a result of such defects. Using optical techniques like edge lighting, small imperfections can be easily seen without the aid of the darken electrochromic medium serving as a background.

Conductive adhesives can be substituted for solder. Conductive adhesives have the advantage of potentially lower setting temperatures. If held below the softening temperature of the epoxy seal 16, about 125 degrees C., the electronics can be safely applied to pre-filled electrochromic mirror elements without causing leaking of the electrochromic medium. This means the electrochromic mirror elements can be tested prior to electronics attachment, avoiding the glass scrap concern.

If thermosetting adhesives are used, rework may be impractical. This may not be a problem if yield is high enough. An alternative that would support rework is a conductive adhesive with a thermoplastic base. Being thermoplastic it can be re-melted just like solder but at a much lower temperature, thereby supporting reworking.

Conductive adhesives can be placed via screen printing, micro volume dispensing or conventional needle dispensing. As mentioned above, if the adhesive is used for the trace patterns, one application can serve both trace and attachment functions.

FIG. 6 shows a cross-sectional view of a portion of mirror element 10a, which includes a display 36 mounted to the rear surface of first substrate 12. In this particular embodiment, tracings 150 are formed by conductive inkjet printing or by other means. Such tracings 150 may not have sufficient adhesive properties for bonding electrical components to the rear surface of substrate 12. Accordingly, an electrically conductive epoxy or other adhesive 152 may be applied under each terminal leg 171 of the electronic components. Such an electrically conductive epoxy 152 would secure the electronic components to the rear surface while also ensuring good electrical coupling between each lead and each of the traces 150. In the particular example shown in FIG. 6, display device 36 may further be secured to the rear surface of substrate 12 using an optical adhesive 172. As further illustrated in FIG. 6, display device 36 is mounted to a particular region on the rear surface of element 12 where a window 170 has been formed in the reflector/electrode 15 so as to allow light emitted from the display 36 to pass through the mirror element. As noted above, window 170 may not be necessary in the event that reflector/electrode is transflective.

Figure 14:
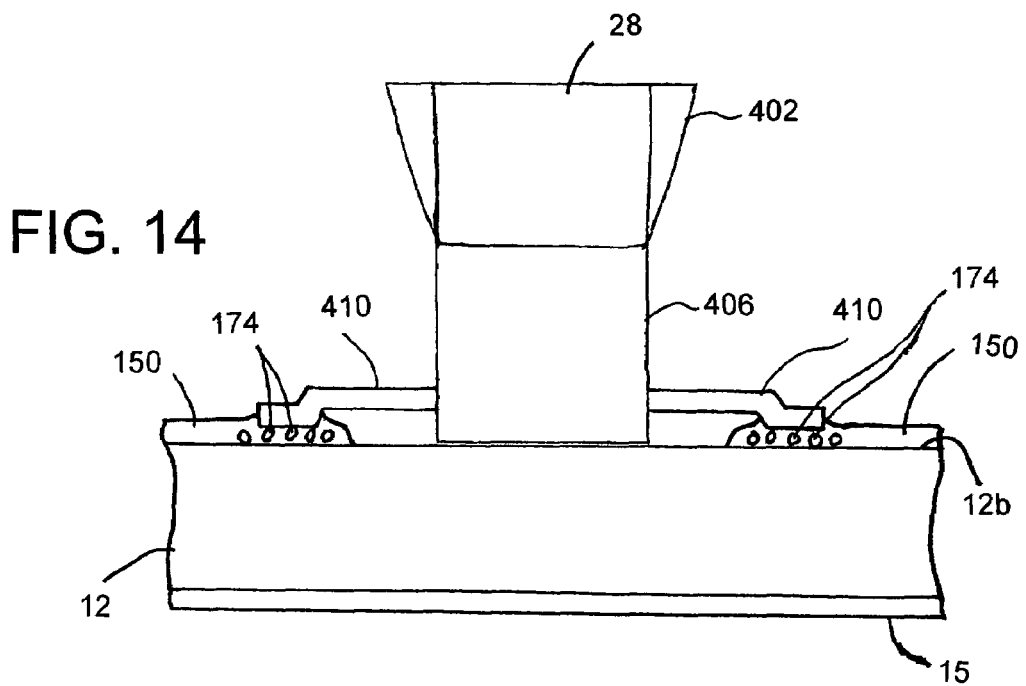
FIG. 14 is a partial cross-sectional view of a portion of the mirror element showing the sensor from the side.

FIG. 14 shows another technique whereby an electronic component may be mounted to the rear surface of substrate 12. In this example, a glare sensor 28 is mounted to the rear surface 12b in an area behind a window 170, which allows light to pass through the mirror element to the sensor 28. Also in this example, tracings 150 are made of a conductive epoxy, which itself will secure the leads 410 of electronic components such as sensor 28 to the rear surface of substrate 12. One potential problem associated with using such a conductive epoxy, however, is that the epoxy may tend to "squish out" when the leads of the electronic component are pressed into the epoxy. As the conductive epoxy squishes outward, it may become possible that the epoxy under a closely spaced adjacent lead may also squish out and create a short between two leads of the electronic component. To prevent such shorting, spacer beads 174 may be disposed within the conductive epoxy. Such beads may be made of electrically conductive material or non-conductive material and may be mixed uniformly throughout the tracings applied to the rear surface 12b of glass substrate 12. Alternatively, such beads may be deposited only in those regions that are potentially squished out by leads of the electronic components. Another technique for preventing shorting is to provide non-conductive epoxy or other material between each of the conductive epoxy tracings in the vicinity of where a device is to be secured. Such non-conductive epoxy would serve as an electrically insulating barrier to prevent shorting when the electronic component is pressed into the conductive epoxy.

The sensor electronic component may further be secured to the rear surface of the substrate 12 using an optical adhesive. For those components that are not optical or that do not require light to pass through the mirror element, any form of suitable epoxy may be used, if needed, to secure the bottom surface of the electrical component to the rear surface 12b.

Once the components are mounted on the glass substrate 12, connection between the electronics and the conductive electrode layers on the inside of the electrochromic mirror element may be made. The conventional means of using metal clips 19 and wires 13 (FIG. 2A) can be used, but avoiding wires, clips, and connectors is possible thereby simplifying assembly and reducing manufacturing and component cost. Conductive adhesive can be laid down in a bead (150a, 150b) making contact along a large length of an electrochromic mirror element to adequately couple to each electrode layer 15 and 17. A wire can be dispensed into this bead to help lateral conduction, reducing the need for expensive fillers to get the required conduction.

Direct mounting onto glass substrate 12 helps the electronic components dissipate heat which is an advantage to the electronics. Prolonged heating of the electrochromic medium could potentially become high enough, and long enough, to discolor or otherwise degrade the electrochromic medium. There is also concern that localized heating could change the clearing rate of the electrochromic medium thereby leading to an undesirable appearance during fast changes in darkening level. Several concepts have been devised addressing this basic heating concern.

This first category of solutions is to dissipate the heat in a way that avoids localized heating to high enough temperatures to cause concern. Heat is generated in two types of electronic components, resistors and active electronics where the output stages are located. If the electronic components that generate heat are spread out enough, the temperature at any one heated region of the electrochromic element will be lower and there will be less difference to cause visual effects.

Heat from a resistor can be spread out by making the resistor very long or by achieving the desired resistance from several smaller resistors connected in series or parallel. A very long and cost-effective resistor can be made by creating the resistor on the glass using a relatively long length conductive tracing 150c (FIG. 1) of resistive material such as a conductive ink, conductive epoxy, or coated metals. By making the resistive tracing long, the area of the glass heated by the resistor can be relatively large and thus the generated heat is spread over a large area of the mirror element. The trace pattern could be wavy to increase the length of the resistor and the area of the mirror element through which heat is dissipated. Active devices may also be fabricated on the glass, such as TFT or organic MOSFETs.

Heat from the resistors and/or the output devices can also be dissipated away from the glass substrate 12 by metal objects acting like heat sinks. According to the embodiment shown in FIGS. 1 and 8, the mirror assembly may comprise a relatively large metal crush plate 202 for securing the mirror element 10a to the mirror mounting bracket 204 via an adjustment socket 206. By utilizing an appropriate heat transfer means, this metal crush plate 202 can also act as a heat sink. One possible means being fingers that would contact the heat generating devices. Heat would then be able to flow out these fingers. Being mechanically compliant, these fingers can be pressed against the devices and yet allow the other fingers or mounting details to predictably mount to the glass substrate in other regions. In the embodiment shown in FIGS. 1 and 8, a flat plate region 202a of crush plate 202 is secured to rear surface 12b using an adhesive or double-sided tape. The adhesive preferably has a high thermal conductivity and no electrical conductivity such that the adhesive may be applied directly over the tracings 150, and preferably over any elongated tracings serving as resistors. Alternatively, a thin layer of an electrically nonconductive material may first be applied over the tracings such that the adhesive need not be electrically nonconductive. As an alternative, a flat plate may be used as a heat sink in place of crush plate 202 or adjustment socket 206 or a ball mount may be directly secured to the rear surface 12b of substrate 12 to serve as a heat sink.

Crush plate 202 allows direct mounting of the mirror element 10a to the mounting bracket 204 or stem of the rearview mirror assembly. Prior rearview mirror assemblies included specially configured housings that had to not only house the mirror element and the electrical components, but which also had to provide the mechanism for attachment to the mirror assembly mounting stem. Thus, the housing previously was made of a rigid plastic and was configured with a number of interior support ribs to provide adequate support to the mirror element while minimizing vibration of the mirror element. Further, housings have been constructed in two-part assemblies including the rear casing 208 and a bezel 210 that extends around the sides and front edges of the mirror element. This prior two-part housing thus required various clips and couplings to allow the bezel to be secured to the casing.

By mounting crush plate 202, adjustment socket 206, a ball mount, or a flat plate to the mirror element, a one-piece housing that is merely decorative may be employed thereby reducing the cost and complexity of the mirror assembly. Further, regardless of whether a one- or two-piece housing is employed, the housing may be simplified by eliminating the need for the housing to provide support for the mirror element 10a.

By locating the heat-generating electrical components near the edge of the glass substrate 12, heat can be dissipated by metal or heat conducting edge contacts. Being at the very edge, the heated regions would impact a smaller visual area and less of the electrochromic medium.

The exact opposite, locating the heat generating electronic components near the center of the mirror element, is also possible since a heat sink, such as crush plate 202 or some other metal structure, may spread and dissipate the heat. Being in the center of the mirror element, the greatest possible area with the shortest possible paths is possible. If the metal layer forming the tracings 150c is provided in the center of the mirror element or if a metal component is attached to the glass substrate 12 to transfer heat throughout this central region, the peak heat at any particular location can be lowered. The visual side effects of central heating of the electrochromic element are the inverse of the effects known from limited surface conduction. Specifically, some existing electrochromic mirror elements may experience delayed clearing or darkening of the center region due to the distance of the central region from the conductive clips attached to the perimeter of the mirror element. Thus, heating of the center of the electrochromic mirror element would advantageously speed up the clearing or darkening of the center of the electrochromic mirror element thereby compensating for this otherwise inherent delay.

Another basic approach to reduce the effects of heat on an electrochromic mirror is to reduce the heat generated by the electronic components. Under this concept, one option emerges as the most preferred. Some existing electrochromic mirror drive control circuits lower the nominal 12-volt supply voltage to about 1.2 volts or less for application to the electrochromic mirror element. By using an efficient switching power supply 86 to initially lower the nominal 12 volts to 5 volts, the heat generated by the electrochromic mirror drive control circuit 24 is greatly reduced. Further, since 5 volts is a popular voltage for electronics, the cost of this supply can be justified by these other possible needs.

Yet another way to avoid heat is to design the output stage for one condition such as only for use with an inside electrochromic mirror. This allows the best efficiency and lower heating.

Another way to address heating is change the nature of the electrochromic chemistry. If the current required to darken and/or hold the dark state of the particular electrochromic medium is reduced, the current flowing through the electronics can be reduced and hence the heat generated by the electronics can be reduced. Examples of electrochromic elements having reduced current requirements are disclosed in U.S. Pat. No. 6,710,906, entitled "CONTROLLED DIFFUSION COEFFICIENT ELECTROCHROMIC MATERIALS FOR USE IN ELECTROCHROMIC MEDIUMS AND ASSOCIATED ELECTROCHROMIC DEVICES," the entire disclosure of which is incorporated herein by reference. There are also electrochromic elements that do not require current to maintain the element in a darkened state. Use of such electrochromic mirror elements would virtually eliminate heat generated to drive the mirror element.

Figure 8:
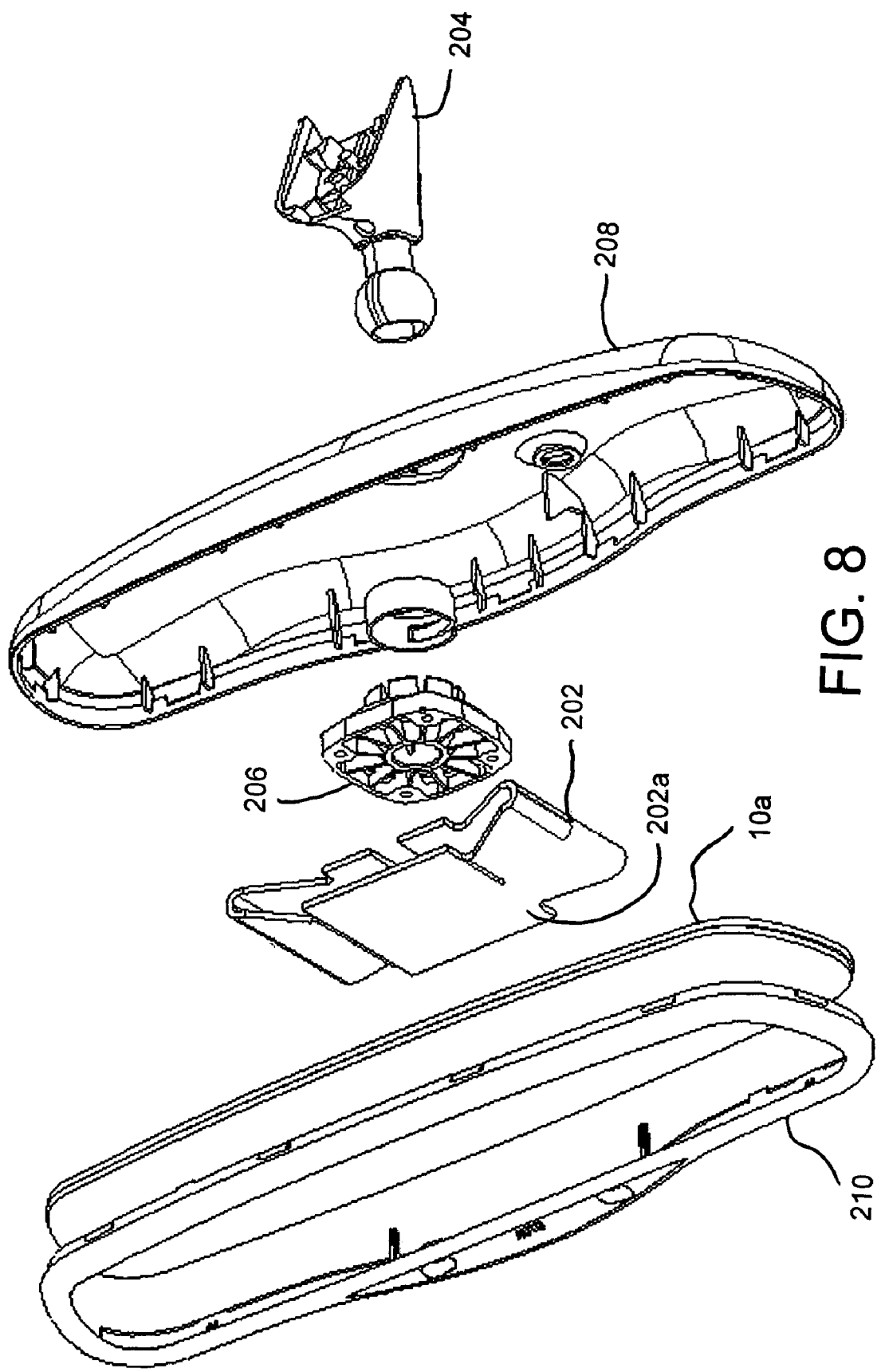
FIG. 8 is an exploded perspective view of a rearview mirror assembly incorporating the mirror element constructed in accordance with the present invention.

Referring to FIGS. 8 and 9, rearview mirrors embodying the present invention may include a bezel 210 which extends around the entire periphery of each individual mirror assembly. The bezel 210 conceals and protects the buss clips 19 of FIG. 2A, as well as the peripheral edge portions of the sealing member 16 and both the front and rear glass elements (14 and 12, respectively). A wide variety of bezel designs are well known in the art, such as, for example, the bezel disclosed in U.S. Pat. No. 5,448,397. There are also a wide variety of housings well known in the art for attaching the mirror assembly to the inside front windshield of an automobile, or for attaching the mirror assemblies to the outside of an automobile. A preferred mounting bracket is disclosed in U.S. Pat. No. 5,377,948.

As discussed above, rearview mirror assemblies typically include various switches 52, which allow the user to select various functions performed by the electronics within the rearview mirror assembly. Typically, electromechanical switches are provided on a portion of a printed circuit board that extends below the mirror element 10. Although such an arrangement may be used with certain features of the present invention, it may be possible to eliminate the need for a printed circuit board to support the switches. Specifically, the mirror element may be made to extend slightly lower than a typical mirror element such that switches may be supported directly on the mirror element substrates. Thus, as shown in FIG. 9, the mirror bezel 210 may be constructed to have a horizontal strip 210a that extends between the mirror viewing area and the portion of the mirror element to be used as a switch region.

FIG. 10A is a cross-sectional view of a portion of the mirror assembly shown in FIG. 9. In the particular embodiment shown, a plurality of switches 52 is provided that include a touch sensitive display switch member 214 that is electrically coupled to a tracing 150 that is disposed on the edge and the rear surface of the mirror element 10. The separate switches may be delineated by vertical lines printed on a surface of the mirror element in front of the reflective layer, or the reflective layer may be etched or removed entirely within the region behind the switch region. Alternatively, vertical portions of bezel 210 may extend from the bottom-most portion of bezel 210 upward to horizontal strip 210a. Such a feature may be beneficial in that it would allow users to feel the demarcation between the various switches 52 provided on the rearview mirror assembly. In addition, it may be possible to provide indicia indicating the function of the switch either on top of or behind the switch membrane 214 or on the rear surface of mirror element 10. Such an indicia display could be constructed in the manner disclosed in U.S. Pat. No. 6,170,956, the entire disclosure of which is incorporated herein by reference. Further, the indicia displays may be illuminated using an LED mounted to the rear of mirror element 10 so as to project light through the mirror element and through the transparent areas of the indicia panel forming the indicia display. The LED may be a multi-chip LED, which is capable of changing color in response to a signal from the microprocessor 22 such that the color of the indicia display may change to indicate the status of the function associated with a particular switch.

FIG. 10B is a cross-sectional view of a portion of a different embodiment of the mirror assembly shown in FIG. 9. In the particular embodiment shown, a plurality of switches 52 is provided that include a membrane switch member 215 that, when depressed, selectively makes contact across two electrically isolated regions of a conductive layer 217 that are both electrically coupled to tracings 150 on the edge and the rear surface of the mirror element 10. Suitable membrane switches are available from SSI Electronics of Belmont, Mich.

Although particular switch structures are shown in FIGS. 9, 10A, and 10B, it will be appreciated that the switches 52 may be formed using other types of switches. For example, a capacitive touch switch may be provided on the front surface of mirror element 10 that is also electrically coupled to circuitry on the rear of the mirror element. Further, another form of switch that may be employed is an optical proximity switch whereby an optical sensor and an LED that emits visible or infrared light may be positioned behind each switch region 52 such that when a user places his or her finger proximate the switch area 52, light that is emitted from the LED passes through the mirror and is reflected from the user's finger back through the mirror and to the sensor. Suitable optical proximity switches are disclosed in U.S. Pat. No. 6,614,579, the entire disclosure of which is incorporated herein by reference.

The present invention has been described as incorporating various electronic components within the mirror housing of a rearview mirror assembly. It will be appreciated by those skilled in the art that various other vehicle accessories and components may be incorporated in the rearview mirror assembly in whole or in part and in various combinations. Such vehicle accessories and components may be mounted within, on or to the mirror housing, the mirror mount, an attachment to the mirror mount or housing, or in a console or other housing associated with the rearview mirror assembly. Additionally, any such vehicle accessories may share components with one another, such as processors, sensors, power supplies, wire harnesses and plugs, displays, switches, antennae, etc. Examples of such vehicle accessories, components or features are described further below.

Figure 11B:
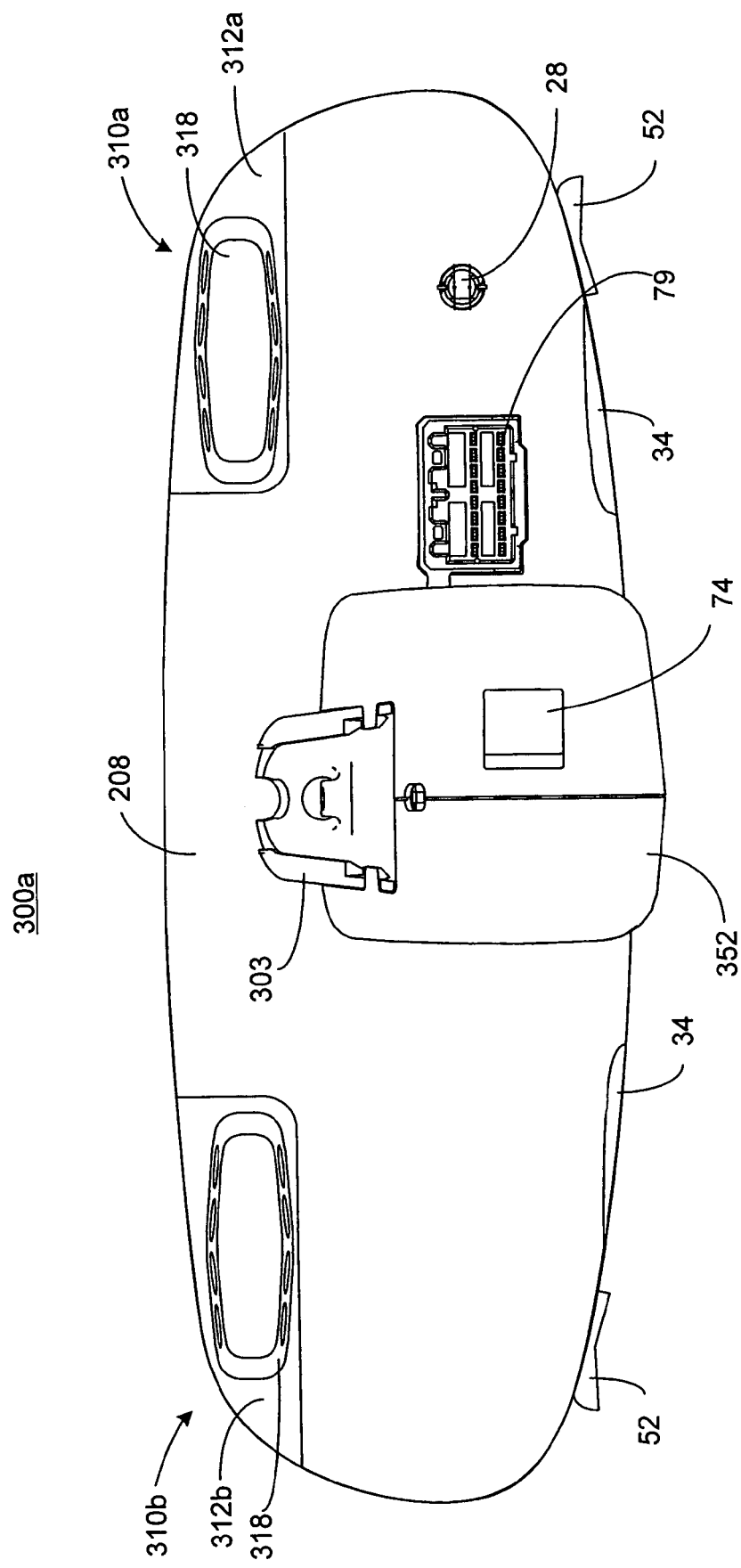
FIG. 11B is an elevational view of the rear of the rearview mirror assembly shown in FIG. 11A.
Figure 11C:
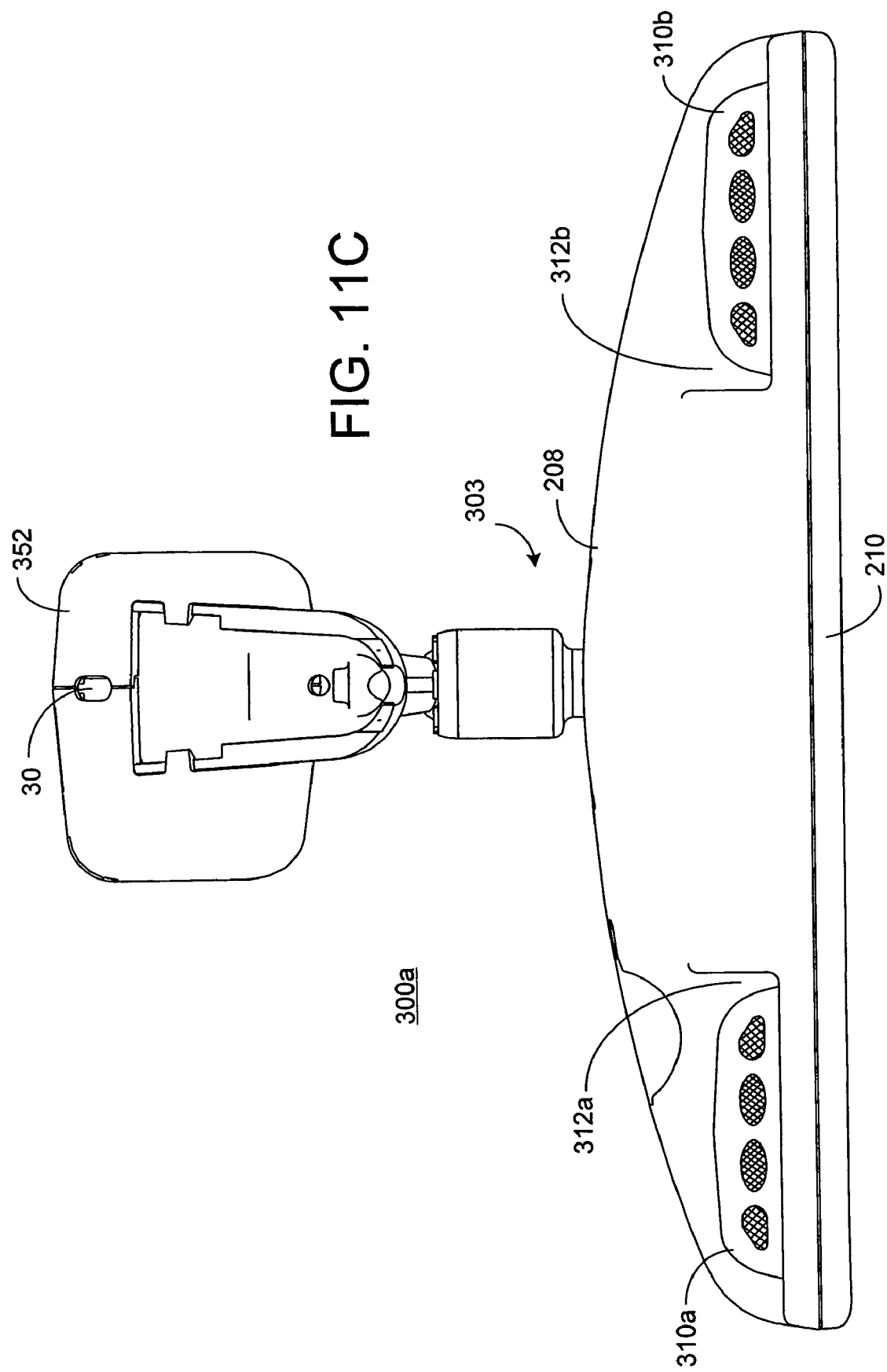
FIG. 11C is a plan view of the top of the rearview mirror assembly shown in FIG. 11A.

FIGS. 11A through 11C show another embodiment of a rearview mirror assembly 300a in which any of the above-described electronic compass systems are incorporated. As illustrated in FIGS. 11A through 11C, mirror assembly 300a comprises a bezel 210 and a case 208. The bezel and the case combine to define the mirror housing 302 for incorporation of features in addition to a reflective element 10 and information displays 36a and 36b. Commonly assigned U.S. Pat. Nos. 6,102,546, D410,607, 6,407,468, 6,420,800, and 6,471,362, the disclosures of which are incorporated in their entireties herein by reference, describe examples of various bezels, cases and associated button constructions that may be used with the present invention.

As depicted in FIGS. 11A-11C, the mirror assembly may comprise first and second microphones 311a and 310b. Examples of microphones for use with the present invention are described in commonly assigned U.S. patent application Ser. No. 09/444,176, U.S. Pat. No. 6,614,911, U.S. Patent Application Publication No. US 2002/0110256 A1, and PCT Application No. PCT/US02/32386, the disclosures of which are incorporated in their entireties herein by reference. Although the two microphones are shown as being mounted to the backside of mirror case 208, one or more such microphones may be mounted on the top of the mirror assembly (as shown in FIGS. 12A and 12B), on the bottom of the mirror assembly, or any where within the mirror case or bezel. Preferably, two microphones 310a and 310b are incorporated, one near each end, into the mirror assembly on the backside of the mirror case within recessed portions 312a and 312b. As shown in FIG. 11A, the microphones are constructed with an acoustic dam 314 extending around transducer 40a within a microphone housing 318. Additional details of this preferred construction are disclosed in commonly-assigned International PCT Application No. PCT/US02/32386, the entire disclosure of which is incorporated herein by reference. The audio systems including the microphones may be integrated, at least in part, in a common control with information displays and/or may share components with the information displays. In addition, the status of these systems and/or the devices controlled thereby may be displayed on the associated information displays.

As shown in FIGS. 12A and 12B, a single microphone 310 is provided on the top side of the mirror assembly 300b. In this construction, it is preferable to include two transducers 40a and 40b in microphone housing 318 in a manner similar to that disclosed in the above-referenced International PCT Application No. PCT/US02/32386 and U.S. Patent Application Publication No. US 2002/0110256 A1.

Mirror assembly 300 may include first and second illumination assemblies 34. Various illumination assemblies and illuminators for use with the present invention are described in commonly assigned U.S. Pat. Nos. 5,803,579, 6,335,548, 6,441,943, 6,521,916, and 6,523,976, as well as commonly assigned U.S. patent application Ser. Nos. 09/723,675, 10/078,906, and 10/230,804 (now U.S. Patent Application Publication No. 2003/0043590 A1), the disclosures of which are incorporated in their entireties herein by reference. Each illumination assembly preferably comprises a reflector, a lens and a light source 34 (FIG. 1). There may be two illumination assemblies generally positioned to illuminate a front passenger seat area and the second generally positioned to illuminate a driver seat area. Alternatively, there may be only one illumination assembly that illuminates both seat areas and/or there may be additional illuminator assemblies such as one to illuminate a center console area, overhead console area or an area between the front seats.

Mirror assembly 300 may also include first and second switches 52. Suitable switches for use with the present invention are described above and are described in detail in commonly assigned U.S. Pat. Nos. 6,407,468, 6,420,800, 6,426,568, 6,614,579, and 6,471,362, the disclosures of which are incorporated in their entireties herein by reference. These switches may be incorporated to control the illumination assemblies, the displays, the mirror reflectivity, a voice activated system, a compass system, a telephone system, a highway toll booth interface, a telemetry system, a headlight controller, a rain sensor, a tire pressure monitoring system, a navigation system, a lane departure warning system, an adaptive cruise control system, etc. Any other display or system described herein or within the references incorporated by reference may be incorporated in any location within the associated vehicle and may be controlled using the switches.

Mirror assembly 300 may also include first and second indicators 32. Various indicators for use with the present invention are described in commonly assigned U.S. Pat. Nos. 5,803,579, 6,335,548, 6,441,943, 6,521,916, and 6,523,976, as well as commonly assigned U.S. patent application Ser. Nos. 09/723,675, 10/078,906, and 10/230,804 (now U.S. Patent Application Publication No. 2003/003590 A1), the entire disclosures of which are incorporated herein by reference. These indicators may indicate the status of the displays, the mirror reflectivity, a voice activated system, a compass system, a telephone system, a highway toll booth interface, a telemetry system, a headlight controller, a rain sensor, a security system, a rear parking aid, etc. Any other display or system described herein or within the references incorporated by reference may be incorporated in any location within the associated vehicle and may have a status depicted by the indicators.

Mirror assembly 300 may further include first and second light sensors 26 and 28 serving as glare and ambient sensors, respectively. Preferred light sensors for use within the present invention are described in detail in commonly assigned U.S. Pat. Nos. 5,923,027, 6,313,457, 6,359,274, 6,379,013, and 6,402,328, U.S. patent application Ser. No. 10/043,977 (now U.S. Patent Application Publication No. US 2002/0056806 A1) and Ser. No. 10/068,540 (now U.S. Patent Application Publication No. US 2003/0127583 A1), the entire disclosures of which are incorporated herein by reference. The glare sensor 26 and/or ambient sensor 28 automatically control the reflectivity of a self-dimming reflective element as well as the intensity of information displays and/or backlighting. The glare sensor 26 may also be used to sense headlights of trailing vehicles and the ambient sensor is used to detect the ambient lighting conditions that the system is operating within.

Figure 13:
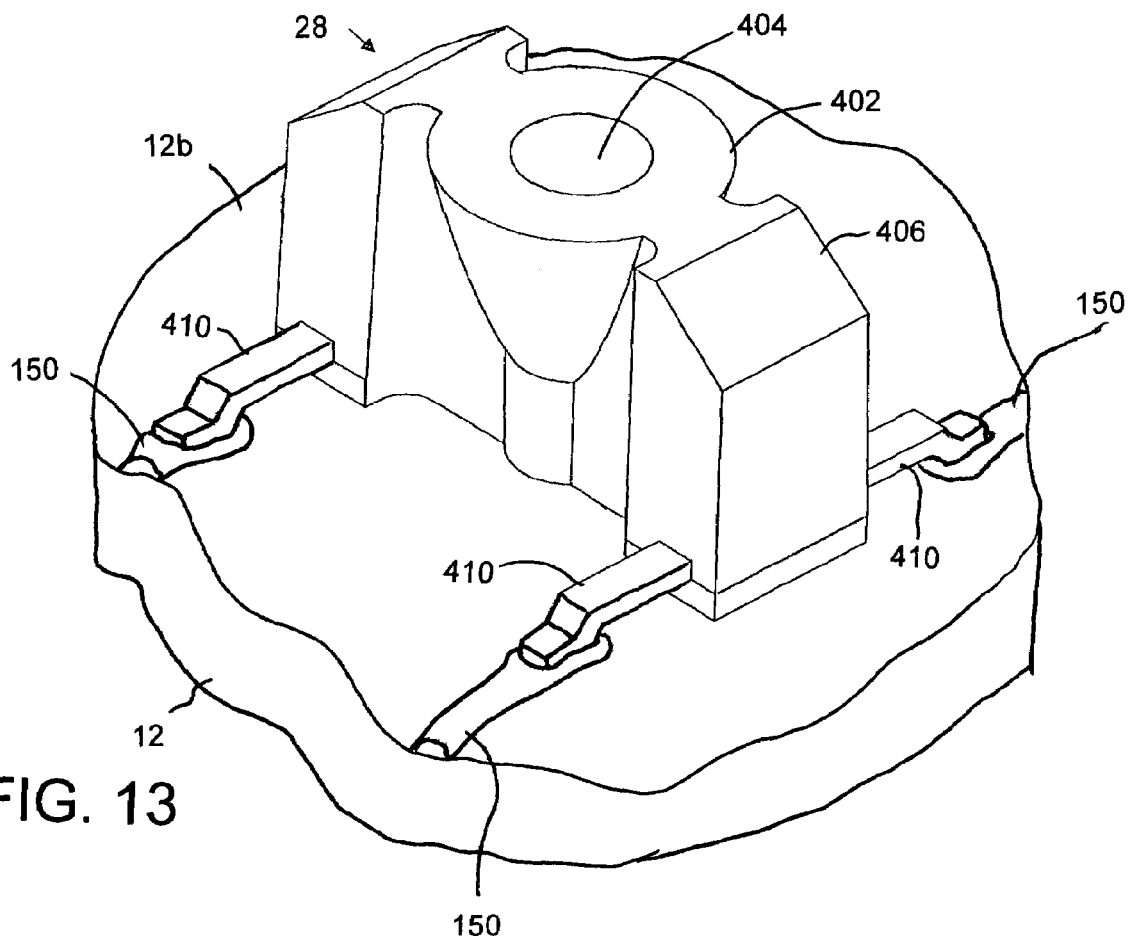
FIG. 13 is a cut-away perspective view showing a close-up of an ambient light sensor that may be used in the mirror element shown in FIG. 1.

FIGS. 13 and 14 show a suitable surface mount light sensor for use as the forward-looking ambient light sensor 28. This particular light sensor is disclosed in commonly assigned U.S. patent application Ser. No. 10/230,804 (now U.S. Patent Application Publication No. 2003/003590 A1), the entire disclosure of which is incorporated herein by reference. This particular sensor is well suited for use in this particular application in that it is designed to be used as a surface mount device and can be mounted in spaced relation from any aperture formed within the casing 208 of housing 302. Preferably, a secondary optical element is disposed in such an aperture. Such a secondary optical element may be a diffuser and/or a lens designed to collect light from a particular field of view. The particular sensor shown in FIGS. 13 and 14 includes a collector portion 402 with an inner lens portion 404 so as to collect the maximum amount of light passing through an aperture within the housing and to focus the light onto the sensing element disposed within the encapsulant 406, which encapsulates the sensor on the lead frame 410 and is molded to function as collector portion 402 and lens portion 404. As shown in FIG. 14, the leads 410 of sensor 28 may be bonded to the rear surface of glass substrate 12 utilizing a suitable conductive epoxy as tracings 150. If needed, spacers 174 may be disposed within the epoxy tracings to prevent squish out upon applying sensor 28 to substrate 12. Such squish out may not occur, however, if the bottoms of leads 410 are slightly higher than the bottom surface of sensor 28. It should also be noted that the bottom of sensor 28 may be adhered to rear surface 12b using any form of common adhesive. Further, tracings 150 may take any of the forms described above.

Figure 15:
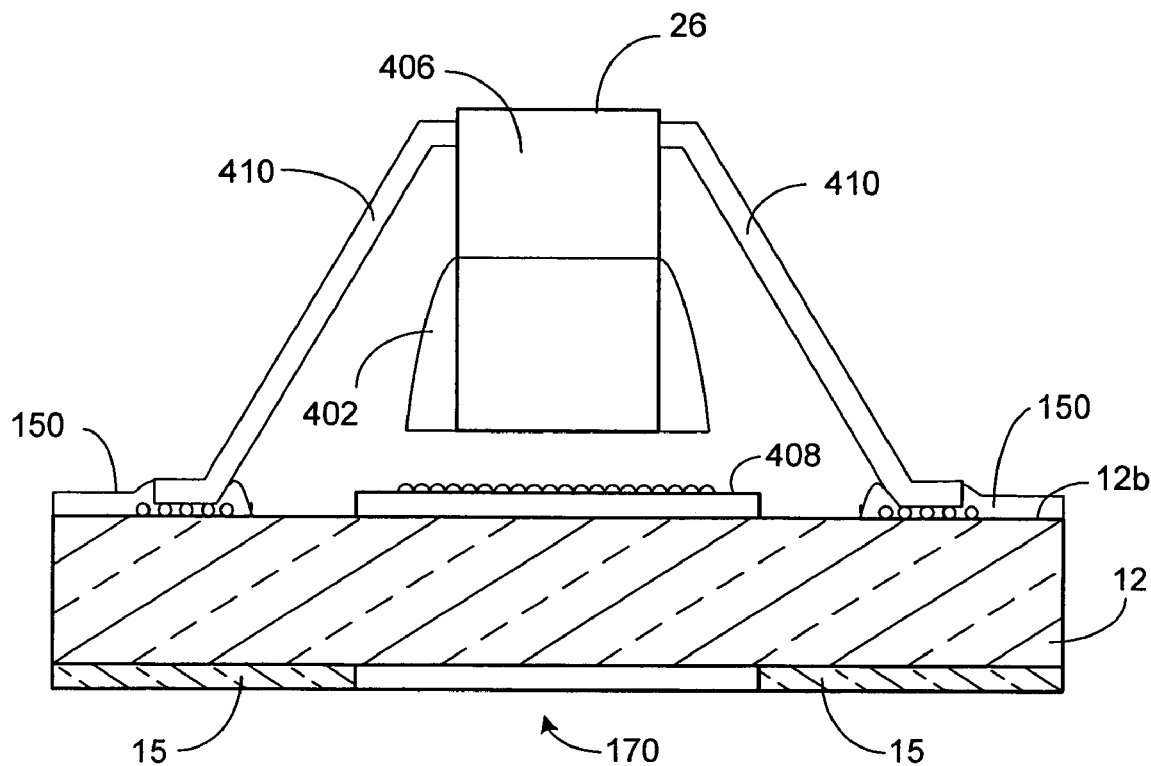
FIG. 15 is a partial cross section of the mirror element showing the side of a glare sensor that may be used in the assembly shown in FIG. 1.

FIG. 15 discloses the same sensor but mounted upside down relative to the one shown in FIG. 14 such that the sensing element may serve as a glare sensor 26, which looks rearward through the glass substrate(s) of the mirror element. As shown in FIG. 15, a window 170 may be provided in the reflective electrode layer 15 to allow light to pass through to sensor 26. In addition, a secondary optical element 408 is preferably provided to define the field of view and optionally to diffuse light received from within the field of view. Preferably, secondary optical element 408 includes an anamorphic lens such as that disclosed in commonly assigned U.S. patent application Ser. No. 10/833,900, filed on Apr. 28, 2004, and entitled "DIMMABLE REARVIEW ASSEMBLY HAVING A GLARE SENSOR," the entire disclosure of which is incorporated herein by reference. An anamorphic lens permits the horizontal field of view to be different from the vertical field of view. Secondary optical element 408 may be attached directly to the rear surface 12b of substrate 12 or may be spaced therefrom. Alternatively, the rear surface 12b may be etched to define a lens or diffuser in a region in front of the sensor 26.

Figure 16:
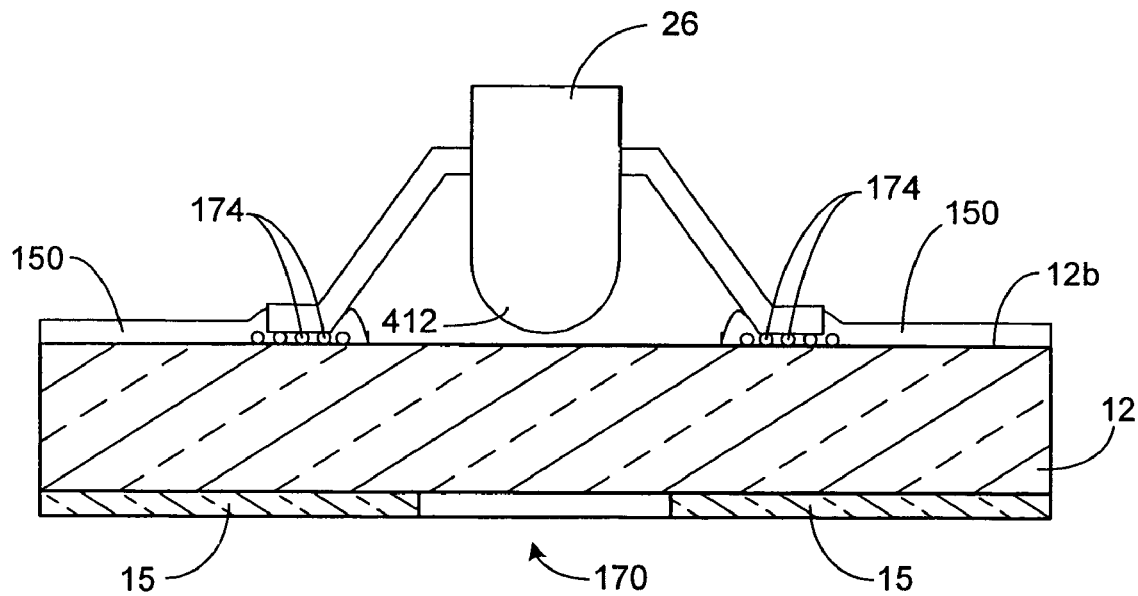
FIG. 16 is a partial cross section of the mirror element showing the side of a different glare sensor that may be used in the assembly shown in FIG. 1.

FIG. 16 shows an alternative construction for a glare sensor 26. In this embodiment, sensor 26 includes an integral anamorphic lens 412, such as that disclosed in U.S. Pat. No. 6,679,608 and in the above-referenced U.S. patent application Ser. No. 10/833,900, the entire disclosures of which are incorporated herein by reference. The anamorphic lens 412 may be cylindrical or bi-radial. By utilizing an integral anamorphic lens 412, a secondary optical element, such as element 408 in FIG. 15, may not be required to obtain a field of view having different dimensions horizontally and vertically. Although not shown in the drawings, it will be appreciated that the sensor shown in FIG. 16 is used as a glare sensor, the same sensor may be used as an ambient light sensor 28 by flipping the sensor over and bending the leads in the other direction.

The electrical output signal from either, or both, of the sensors 26 and 28 may be used as inputs to a controller (not shown) to control the reflectivity of reflective element 10*a* and/or, the intensity of any one or all of the displays 36*a* and 36*b*. The details of various control circuits for use herewith are described in commonly assigned U.S. Pat. Nos. 5,883,605, 5,956,012, 6,084,700, 6,222,177, 6,224,716, 6,247,819, 6,249,369, 6,392,783 and 6,402,328, the disclosures of which are incorporated in their entireties herein by reference. These systems may be integrated, at least in part, in a common control with information displays and/or may share components with the information displays. In addition, the status of these systems and/or the devices controlled thereby may be displayed on the associated information displays.

In another embodiment, a sky sensor 30 may be incorporated positioned to detect light levels generally above and in front of an associated vehicle. The sky sensor 30 may be used to automatically control the reflectivity of a self-dimming element, the exterior lights of a controlled vehicle and/or the intensity of information displays. The mirror assembly may further include sun-load sensors for sensing light levels towards the driver side and passenger side of the vehicle so as to control the climate control system of the vehicle.

Additionally, mirror assembly 300 may include first, second, third, fourth and fifth operator interfaces 52*a*-52*e* located in mirror bezel 210. Each operator interface is shown to comprise a backlit information display "A," "AB," "A1," "C," and "12." It should be understt that these operator interfaces can be incorporated anywhere in the associated vehicle, for example, in the mirror case, accessory module, instrument panel, overhead console, dash board, seats, center console, etc. Suitable switch construction is described in detail in commonly assigned U.S. Pat. Nos. 6,407,468, 6,420,800, 6,426,568, 6,614,579, and 6,471,362, the disclosures of which are incorporated in their entireties herein by reference. These operator interfaces may control the illumination assemblies, the displays, the mirror reflectivity, a voice activated system, a compass system, a telephone system, a highway toll booth interface, a telemetry system, a headlight controller, a rain sensor, a tire pressure monitoring system, a navigation system, a lane departure warning system, an adaptive cruise control system, etc. Any other display or system described herein or within the references incorporated by reference may be incorporated in any location within the associated vehicle and may be controlled using an operator interface or interfaces. For example, a user may program a display or displays to depict predetermined information or may program a display or displays to scroll through a series of information, or may enter set points associated with certain operating equipment with associated sensor inputs to display certain information upon the occurrence of a given event. In one embodiment, for example, a given display may be in a non-illuminated state until the engine temperature is above a threshold, the display then automatically is set to display the engine temperature. Another example is that proximity sensors located on the rear of a vehicle may be connected to a controller and combined with a display in a rearview mirror to indicate to a driver the distance to an object; the display may be configured as a bar that has a length proportional to the given distance.

Although specific locations and numbers of these additional features are depicted in FIGS. 11A-11C and 12A and 12B, it should be understood that fewer or more individual devices may be incorporated in any location within the associated vehicle and as described within the references incorporated herein.

A mirror mount 303 is included for mounting the mirror assembly within a vehicle either to windshield 298, or to the vehicle roof structure. It should be understood that a host of accessories may be incorporated into the mount 303 or into a housing 352 attached to mount 303 such as a rain sensor 76, a camera 74, a headlight control, an additional microprocessor, additional information displays, compass sensors, speakers, etc. These systems may be integrated, at least in part, in a common control with information displays and/or may share components with the information displays. In addition, the status of these systems and/or the devices controlled thereby may be displayed on the associated information displays.

Although the compass sensor module 38 is described as being mounted to rear surface 12*b* of substrate 12, it should be understood that the sensor module may be located within mount 303, an accessory module 352 positioned proximate mirror assembly 300 or at any location within an associated vehicle such as under a dash board, in an overhead console, a center console, a trunk, an engine compartment, etc. The above described compass systems may be integrated, at least in part, in a common control with information displays and/or may share components with the information displays. In addition, the status of these systems and/or the devices controlled thereby may be displayed on the associated information displays.

The compass system further includes a controller, such as a microprocessor 22, and an information display 36*a*. The microprocessor may, for example, receive signal(s) from the compass sensor module 38 and process the signal(s) and transmit signal(s) to display 36*a* to indicate the corresponding vehicle heading. As described herein and within the references incorporated by reference herein, the controller may receive signal(s) from light sensor(s), rain sensor(s) (not shown), automatic vehicle exterior light controller(s) (not shown), microphone(s), global positioning systems (not shown), telecommunication systems (not shown), operator interface(s) and a host of other devices, and control the information display(s) to provide appropriate visual indications.

The compass system described above may include a compass sensor circuit 38 such as the magnetometer circuit disclosed in commonly assigned U.S. Pat. No. 6,653,831, the entire disclosure of which is incorporated herein by reference. As disclosed in commonly assigned U.S. Pat. Nos. 6,023,229 and 6,140,933, in U.S. Patent Application Publication No. 2003/0167121 A1, and in U.S. Provisional Patent Application No. 60/449,828, filed on Feb. 24, 2003, the compass sensors 38 may be mounted inside housing 302 or proximate the mounting bracket 303. Preferably, microprocessor 22 is programmed in the manner disclosed in U.S. Patent Application Publication No. 2003/0167121 A1, and in U.S. Provisional Patent Application No. 60/449,828, filed on Feb. 24, 2003, the entire disclosures of which are incorporated herein by reference.

The controller (or controllers) 22 used to control the compass system may, at least in part, control the mirror reflectivity, exterior lights, rain sensor, compass and information displays 36, windshield wipers, heater, defroster, defogger, air conditioning, telephone system, navigation system, security system, tire pressure monitoring system, a garage door opening transmitter, remote keyless entry, telemetry systems, voice recognition systems such as digital signal processor based voice actuation systems, and vehicle speed. The controller 796 (or controllers) may receive signals from switches and or sensors associated with any of the devices described herein and in the references incorporated by reference herein to automatically manipulate any other device described herein or described in the references included by reference. The controller may be, at least in part, located outside the mirror assembly or may comprise a second controller elsewhere in the vehicle or additional controllers throughout the vehicle. The individual processors may be configured to communicate serially, in parallel, via BLUETOOTH™ protocol, wireless communication, over the vehicle bus, such as a CAN bus or a LIN bus, or any other suitable communication link or combination of these links. A multi-pin connector interface 79 may be provided for such external connections.

Exterior light control systems as described in commonly assigned U.S. Pat. Nos. 5,990,469, 6,008,486, 6,130,421, 6,130,448, 6,255,639, 6,049,171, 5,837,994, 6,403,942, 6,281,632, 6,291,812, 6,469,739, 6,465,963, 6,429,594, 6,587,573, 6,611,610, 6,621,616, 6,653,614, and 6,379,013, and U.S. Patent Application Nos. 60/404,879, 60/394,583, 10/235,476 (now U.S. Patent Application No. 2003/0107323 A1), and Ser. No. 10/208,142, the entire disclosures of which are incorporated herein by reference, may be incorporated in accordance with the present invention. These systems may be integrated, at least in part, in a common control with information displays and other accessories and/or may share components with the information displays and other accessories. In addition, the status of these systems and/or the devices controlled thereby may be displayed on the associated information displays As disclosed in U.S. Pat. No. 6,587,573, both the compass sensors 38 and the imaging sensor array 74, may be housed in an accessory housing 352 attached to mount 303.

Moisture sensors and windshield fog detector systems 76 are described in commonly assigned U.S. Pat. Nos. 5,923,027, 6,617,564, 6,313,457, and 6,681,163, the disclosures of which are incorporated in their entireties herein by reference. These systems may be integrated, at least in part, in a common control with information displays and/or may share components with the information displays. In addition, the status of these systems and/or the devices controlled thereby may be displayed on the associated information displays.

Commonly assigned U.S. Pat. No. 6,262,831, the disclosure of which is incorporated herein by reference in its entirety, describes power supplies for use with the present invention. These systems may be integrated, at least in part, in a common control with information displays and/or may share components with the information displays and other accessories. In addition, the status of these systems and/or the devices controlled thereby may be displayed on the associated information displays.

The mirror assembly may further include one or more antennae 62, 64, 66 for receipt and/or transmission of RF signals. Appropriate RF receiving/transmitting circuitry 56, 58, 60, and/or processing circuitry 22 may further be included in or attached to the mirror assembly. Such antennae may be used for a cellular telephone system 58, a BLUETOOTH™ transmitting/receiving system 56, a remote keyless entry (RKE) system, a trainable garage door opener system, a tire pressure monitoring system, a global positioning satellite system, an electronic toll collection (ETC) system, a LORAN system, etc. Some of these systems may share a common antenna and receiving, transmitting, processing, and display circuits 36 where appropriate. Examples of a tire pressure monitoring system incorporated in a rearview mirror assembly are disclosed in commonly assigned U.S. Pat. Nos. 6,215,389 and 6,431,712 and in U.S. patent application Ser. Nos. 09/359,144 and 09/949,955 (now U.S. Patent Application Publication No. US 2003/0048178 A1), the entire disclosures of which are incorporated herein by reference. Examples of a GPS system incorporated in a rearview mirror assembly are disclosed in commonly assigned U.S. Pat. Nos. 6,166,698, 6,297,781, 6,396,446, and in U.S. Patent Application Publication No. US 2002/0032510 A1, the entire disclosures of which are incorporated herein by reference. An example of a LORAN system incorporated in a rearview mirror assembly is disclosed in commonly assigned U.S. Pat. No. 6,539,306, the entire disclosure of which is incorporated herein by reference. An example of both telephone/telematics system and a BLUETOOTH™ system incorporated in a rearview mirror assembly is disclosed in commonly assigned U.S. Patent Application No. U.S. 2002/0032510 A1, the entire disclosure of which is incorporated herein by reference. Examples of a trainable garage door opening systems and RKE systems incorporated in a rearview mirror assembly are disclosed in U.S. Pat. No. 6,091,343, the entire disclosures of which are incorporated herein by reference.

As noted above, the mirror may further include an IR transmitter/receiver 68 for transmitting/receiving information to and from the mirror assembly and possibly to and from the vehicle. An example of such a rearview mirror assembly is disclosed in commonly assigned U.S. Pat. No. 6,407,712, the entire disclosure of which is incorporated herein by reference.

As also described above, the mirror assembly may further include one or more of the same or different types of displays 36. Examples of different types of displays include vacuum fluorescent, LCD, reverse LCD, LED, organic LED, dot matrix, backlit indicia, etc. For displays intended to simultaneously display significant amounts of information, the display disclosed in commonly assigned U.S. Pat. No. 6,346,698 may be used, the entire disclosure of which is incorporated herein by reference. Examples of backlit indicia panel displays are disclosed in commonly assigned U.S. Pat. Nos. 6,170,956, 6,572,233, and 6,356,376 and in U.S. patent application Ser. No. 09/586,813, the entire disclosures of which are incorporated herein by reference. Various displays used in rearview mirrors are disclosed in commonly assigned U.S. Pat. No. 6,356,376 and in U.S. Patent Application Publication No. U.S. 2002/0154379 A1, the entire disclosures of which are incorporated herein by reference.

The wiring for the vehicle accessories in the rearview mirror assembly housing may be run through the mounting bracket and along the windshield (if the mounting bracket does not already extend to the headliner) under a channel mount. An example of a rearview mirror assembly in which the wiring for accessories in the mirror assembly housing is routed through the mounting bracket is disclosed in commonly assigned U.S. Pat. No. 6,467,919, the entire disclosure of which is incorporated herein by reference.

While the present invention has been described as being implemented with the sensors positioned within the housing of a rearview mirror assembly, the sensors could be mounted in the mounting foot or in any other location of the rearview mirror assembly. Further still, any or all of the various components of the inventive electronic compass may be mounted elsewhere in the vehicle. It will be further appreciated that certain embodiments of the present invention are novel and useful in vehicles such as land-based vehicles (i.e., automobiles, trucks, sport utility vehicles (SUVs), trains, motorcycles, bicycles, mopeds, scooters, snowmobiles, all-terrain vehicles (ATVs), and military vehicles) as well as in other vehicles such as airplanes, marine vessels, and amphibious vehicles.

Figure 17:
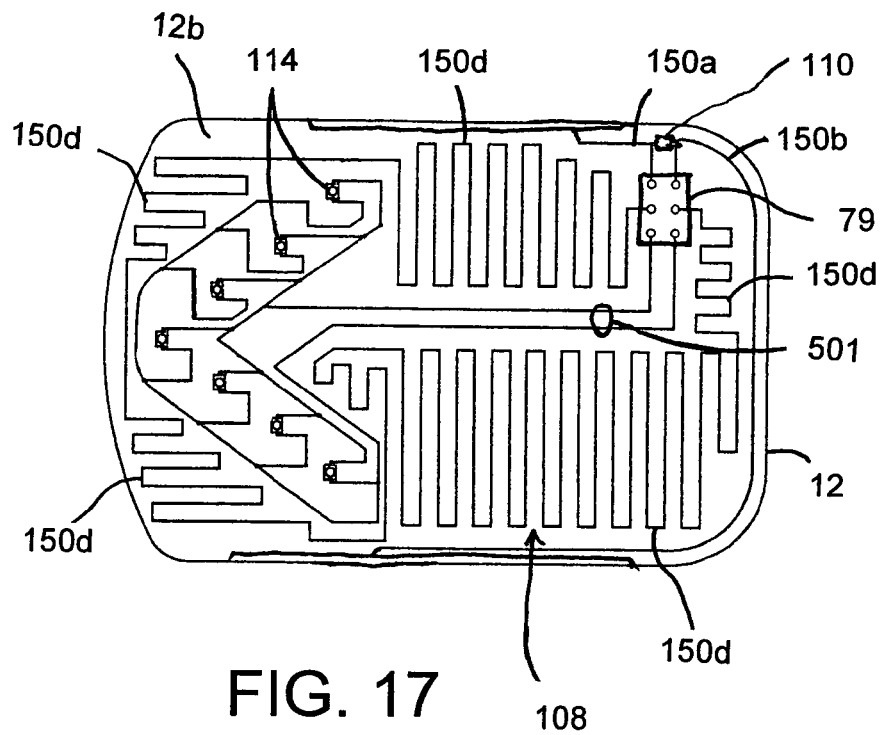
FIG. 17 is an elevational view of the rear of an outside rearview mirror element constructed in accordance with the present invention.
Figure 18:
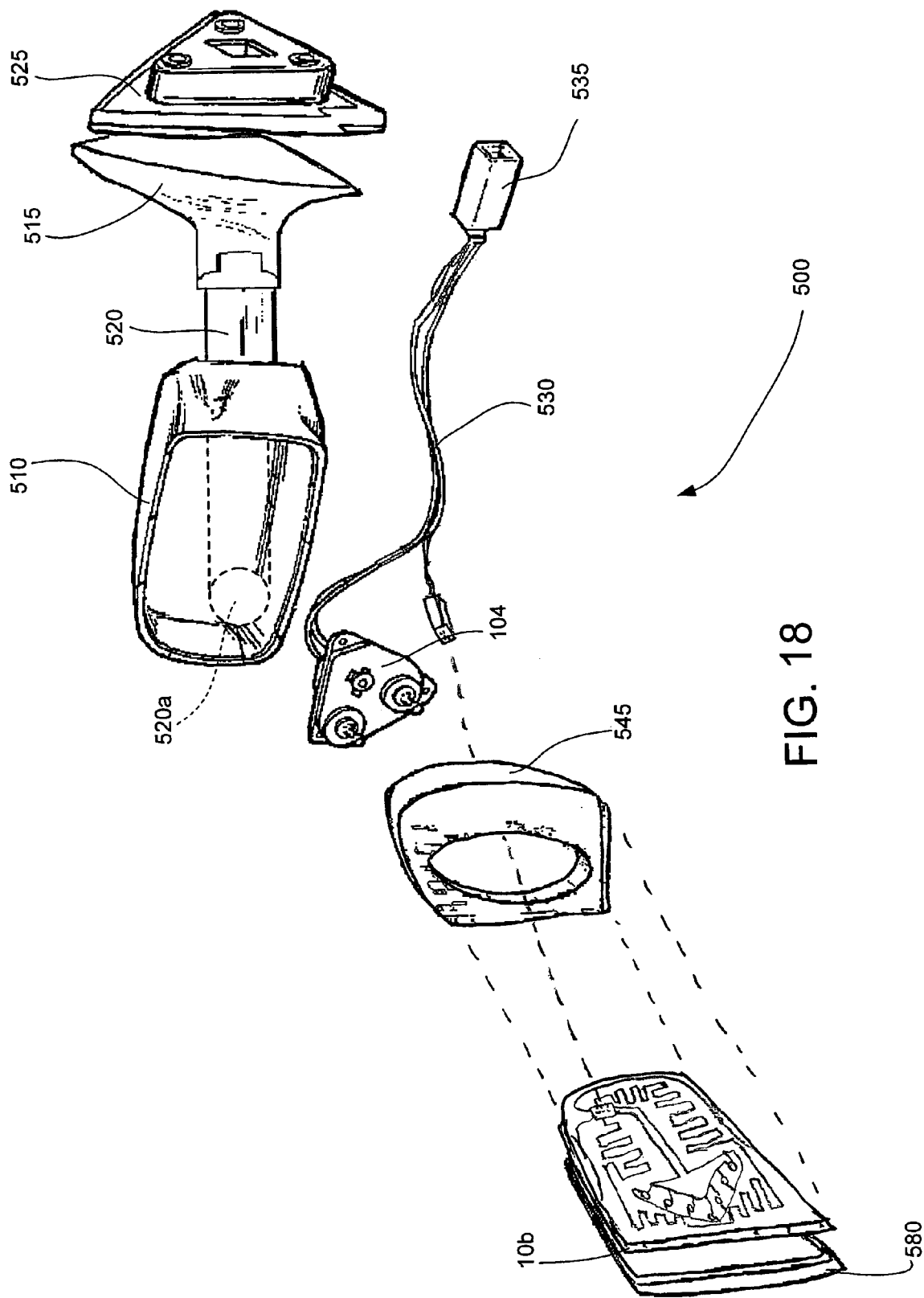
FIG. 18 is an exploded perspective view of an outside rearview mirror assembly incorporating the mirror element of the present invention.

Turning now to FIG. 17, there is shown an outside electrochromic mirror element 10b constructed in accordance with one embodiment of the present invention. Outside electrochromic mirror element 10b is constructed similar to element 10a described above, with the exception of its shape and the electrical components that are typically found in outside rearview mirror assemblies. FIG. 18 shows an exploded view of an exterior rearview mirror assembly 500 in which element 10b may be housed. Assembly 500 includes a housing 510 connected to an attachment member 515 via a telescoping extension 520. In at least one embodiment, the telescoping extension 520 comprises a single arm having a linear actuator for extending and retracting the telescoping extension from within the associated vehicle. The telescoping extension 520 may comprise a rack and pinion type linear actuator, an electrical solenoid type linear actuator, a pneumatic piston or a hydraulic actuator. The housing 510 may be configured such that the housing axially pivots about the telescoping extension to provide a power folding mechanism 106. Additionally, the telescoping extension may be configured such that the housing may be folded inward toward the associated vehicle and outward away from the associated vehicle. The attachment member 515 is configured to be received by a vehicle mount 525. The vehicle mount may be fixed to a door panel, an A-pillar, a front fender, a window assembly, or any other position where a driver can view the scene generally rearward of the associated vehicle. It should be understood that the telescoping extension may comprise two or more arms and that the housing may be configured to pivot and fold irrespective of the number of arms employed. It should also be understood that the housing may be connected to a non-telescoping extension at a location shown as reference number 520a such that the housing pivots about the connection 520a such that the mirror may be positioned closer or farther from the vehicle as desired; this feature may be accompanied by a power positioning mechanism such that actuation may be performed inside the vehicle. It should be understood that the mirror housing, extension and attachment member may be configured such that the telescoping, pivoting and folding require a manual operation.

A wiring harness 530 with a connector 535 is provided to interface the exterior mirror with an associated apparatus located inside the associated vehicle. The wiring harness may be configured to provide extension, folding and pivoting of the housing and may also be configured to provide reflective element control, electrical power, turn signal actuation, mirror heater control, mirror element positioning, light sensor interface, exterior mirror circuit board interface, transceiver interface, information display interface, antenna interface, light source power and control, emergency flasher interface, and all other electrical features as described herein. It should be understood that operator interfaces are provided within the vehicle for each of these features where appropriate.

A mirror element positioning mechanism 104 is provided for aligning the associated reflective element within the housing from the interior of the associated vehicle. It should be understood that a corresponding operator interface is provided within the vehicle for positioning of the reflective element.

The positioning mechanism 104 is mechanically connected to a carrier 545 for providing a secure structure for supporting and moving of the associated reflective element 10b. Examples of suitable carriers are described in U.S. Pat. Nos. 6,195,194 and 6,239,899, the disclosures of which are incorporated herein in their entireties by reference.

In at least one embodiment, the following components may be mounted to the rear surface of the mirror element 10b: a light source such as a turn signal light 114, a keyhole illuminator 92, or an outside door area illuminator 92, as taught in U.S. Pat. No. 6,441,943, the entire disclosure of which is incorporated in its entirety herein by reference, an information display 36, an antenna (96, 98), an RF transmitter, receiver, or transceiver 100, a reflective element control 24, an outside mirror communication system (116), a remote keyless entry system, proximity sensors, and interfaces for other apparatus described herein. U.S. Pat. Nos. 6,244,716, 6,523, 976, 6,521,916, 6,441,943, 6,335,548, 6,132,072, 5,803,579, 6,229,435, 6,504,142, 6,402,328, 6,379,013, and 6,359,274 disclose various electrical components and electrical circuit boards that may be employed in one or more embodiments, the disclosures of each of these U.S. patents are incorporated herein in their entireties by reference.

Figure 19:
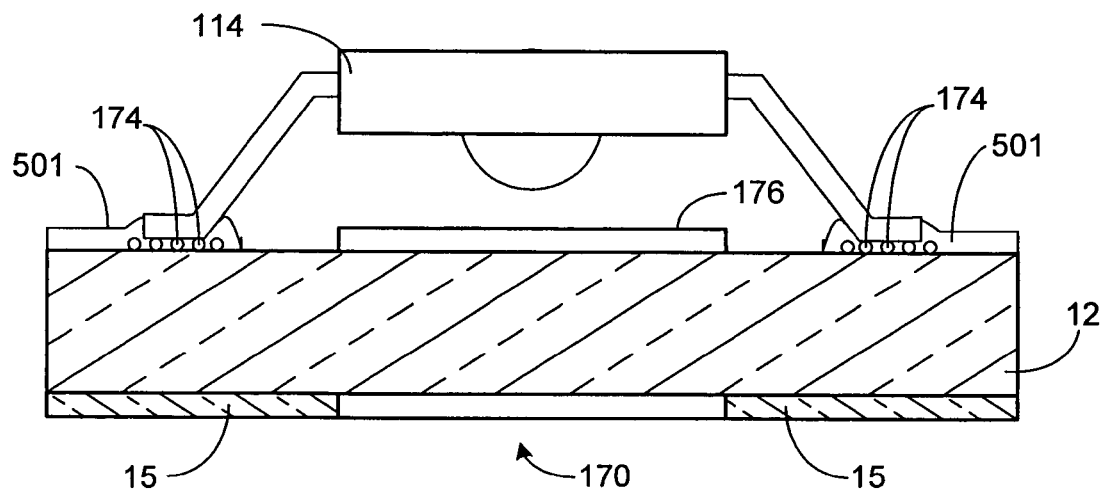
FIG. 19 is a close-up cross-sectional view of an LED mounted to the rear of the inventive mirror element.

As shown in FIGS. 17 and 19, the LEDs forming turn signal indicator 114 are directly mounted to the rear surface 12b of substrate 12 and are electrically coupled via conductive traces 501 that are deposited on rear surface 12b. Traces 501 extend to a connector terminal 79 to receive power from an external source via the wiring harness 530. As shown in FIG. 19, LED 114 is mounted to substrate 12 such that the light emitted therefrom projects through a window or transflective region in the reflector/electrode 15 towards the rear of the vehicle. A light control film or other optical element such as a deviator 176 may be positioned between the LED 114 and the window 170 to direct the light from the LED away from the eyes of the driver. Alternatively or additionally, the LED may be mounted so as to have its optical axis aimed outward away from the eyes of the driver.

The LEDs of turn signal indicator 114 are LEDs that emit red light or LEDs that emit amber light, as would be used in some countries such as Japan. Alternatively, the LEDs could include two LED chips, one for emitting red light and the other for emitting amber light. In this manner, one outside mirror element could be supplied to a vehicle manufacturer with the color selected at the assembly plant or at the car dealership depending upon the requirements of the country where the vehicle is sold. The selection may be made using a user interface on the inside mirror or located elsewhere in the vehicle. If the vehicle is equipped with a GPS system, the GPS system could be used to identify the country in which the vehicle is located and cause the LED turn signal color to change automatically.

Also coupled to connector terminal 79 are traces 150a and 150b, which extend to the electrodes of electrochromic mirror element 10b in the manner described above. As also discussed above, a protective diode 110 may be coupled across traces 150a and 150b and mounted directly to the rear surface 12b of substrate 12 in order to protect the electrochromic element from damage in the event of a reverse polarity coupling.

In at least one embodiment, a mirror heater 108 is provided for improving the operation of the device and for melting frozen precipitation that may be present. Examples of various heaters are disclosed in U.S. Pat. Nos. 5,151,824, 6,244,716, 6,426,485, 6,441,943 and 6,356,376, the disclosures of each of these patents are incorporated in their entireties herein by reference. Preferably, the heater 108 is formed directly on the rear surface of mirror element 108 by providing numerous serpentine conductive traces 150d having some resistivity. In this way, the traces 150d uniformly heat the mirror element whenever current is passed through the traces.

In at least one embodiment, the rearview mirror assembly is provided with a bezel 580 for protecting the associated seal from damaging light rays and to provide an aesthetically pleasing appearance. Examples of various bezels are disclosed in U.S. Pat. Nos. 5,448,397, 6,102,546, 6,195,194, 5,923,457, 6,238,898, 6,170,956 and 6,471,362, the disclosures of which are incorporated herein in their entireties by reference. Traces 150c also extend to a connector terminal 79 to receive power from an external source via the wiring harness 530.

Although the present invention has been described primarily for use with electrochromic mirror elements, it will be appreciated that the invention may be applied to other forms of mirror elements whether they are plain mirrors or mirrors that have reversibly variable reflectance.

While the invention has been described in detail herein in accordance with certain preferred embodiments thereof, many modifications and changes therein may be affected by those skilled in the art without departing from the spirit of the invention. Accordingly, it is our intent to be limited only by the scope of the appending claims and not by way of the details and instrumentalities describing the embodiments shown herein.

The invention claimed is:

1. A rearview mirror element for use in a vehicle, the mirror element comprising:
   a first substrate having a front surface and a rear surface;
   a reflective coating disposed on at least one of said surfaces of said first substrate;
   a component first light sensor secured to the rear surface of said first substrate, wherein said light sensor is configured and is secured to said first substrate to sense light passing through said first substrate; and
   a second light sensor secured to the rear surface of said first substrate,
   wherein said first and second light sensors are configured and secured to said first substrate to sense light from generally opposite directions, and
   wherein at least a portion of said rear surface of said first substrate functions as a circuit board.

2. The rearview mirror element of claim 1, wherein said mirror element is an electrochromic mirror element comprising a transparent second substrate positioned in front of said first substrate, wherein said reflective coating is applied to said front surface of said first substrate.

3. The rearview mirror element of claim 2, and further comprising a third substrate positioned between said first and second substrates, wherein said reflective coating is applied to a surface of said third substrate.

4. The rearview mirror element of claim 2, wherein said light sensors are components of a drive circuit for the electrochromic mirror element.

5. The rearview mirror element of claim 2, wherein said reflective coating is electrically conductive, and further comprising a transparent conductive layer applied to a rear surface of said second substrate.

6. The rearview mirror element of claim 5 and further comprising electrically conductive tracings provided on said rear surface of said first substrate electrically coupled to reflective coating and said transparent conductive layer.

7. The rearview mirror element of claim 2, wherein said second substrate is a glass substrate.

8. The rearview mirror element of claim 1 and further comprising electrically conductive tracings provided on said rear surface of said first substrate.

9. The rearview mirror element of claim 8, wherein said electrically conductive tracings are printed onto said rear surface of said first substrate.

10. The rearview mirror element of claim 8, wherein said electrically conductive tracings are made of an epoxy filled with an electrically conductive material.

11. The rearview mirror element of claim 8, wherein said tracings are used to bond said electronic component to said first glass substrate.

12. The rearview mirror element of claim 1 and further comprising a light source secured to the rear surface of said first substrate.

13. The rearview mirror element of claim 1 and further comprising a microprocessor secured to the rear surface of said first substrate.

14. The rearview mirror element of claim 1 and further comprising a display device secured to the rear surface of said first substrate.

15. The rearview mirror element of claim 1 and further comprising a compass sensor secured to the rear surface of said first substrate.

16. The rearview mirror element of claim 1, and further comprising an electronic circuit component secured to the rear surface of said first substrate, wherein said electronic circuit component is selected from the group comprising: a blind spot indicator; a security light; a GPS receiver; an RF antenna; a microwave antenna; a lane detection sensor; an RF transmitter; an RF receiver; an RF transceiver; a mirror power folding mechanism; a mirror positioning mechanism; a mirror heater; a glare sensor; a temperature probe; an ambient light sensor; a sky light sensor; a user-actuated switch; a memory circuit; a map light; a microphone; an audio amplifier; a speech synthesizer; a DSP; a voice recognition circuit; an IR transmitter; an IR receiver; an imaging sensor; a moisture sensor; a reverse parking aid; and a vehicle bus interface.

17. The rearview mirror element of claim 1, wherein said first substrate is transparent.

18. The rearview mirror element of claim 1, wherein said first substrate is a glass substrate.

19. The rearview mirror element of claim 1, wherein said first substrate is substantially non-transparent.

20. An electrochromic rearview mirror element for use in a vehicle, the electrochromic mirror element comprising:
    a first substrate having a front surface and a rear surface;
    a transparent second substrate positioned in front of said first substrate;
    an electrochromic medium disposed between said first and second substrates;
    first and second electrically conductive layers disposed between said first and second substrates and electrically coupled to said electrochromic medium; and
    electrically conductive tracings disposed on said rear surface of said first substrate and electrically coupled to said first and second electrically conductive layers.

21. The electrochromic rearview mirror element of claim 20 and further comprising an electronic circuit component secured to the rear surface of said first substrate.

22. The electrochromic rearview mirror element of claim 21, wherein said electronic circuit circuit component is a diode connected to one of said first and second electrically conductive layers via an electrically conductive tracing, for protection from reverse polarity connection to a power supply.

23. The electrochromic rearview mirror element of claim 21, wherein said electronic circuit component is a component of a drive circuit for the electrochromic mirror element.

24. The electrochromic rearview mirror element of claim 20 and further comprising a reflective coating applied to said front surface of said first substrate.

25. The electrochromic rearview mirror element of claim 20, wherein said first electrically conductive layer is reflective and said second electrically conductive layer is transparent and is applied to a rear surface of said second substrate.

26. The electrochromic rearview mirror element of claim 20, wherein said first electrically conductive layer is applied to a front surface of said first substrate.

27. A review mirror element for use in a vehicle, the rearview mirror element comprising:
    a first substrate having a front surface and a rear surface;
    a reflective coating disposed on at least one of said surface of said first substrate; and
    a switch comprising a first electrical contact disposed on one of said front and rear surfaces of said first substrate, wherein said switch is a membrane switch comprising a switch membrane with a movable electrical contact for selectively contacting said first electrical contact on said first substrate when said switch membrane is pressed.

28. A rearview mirror element for use in a vehicle, the rearview mirror element comprising:
    a first substrate having a front surface and a rear surface;
    a reflective coating disposed on at least one of said surfaces of said first substrate; and a switch comprising a first electrical contact disposed on one of said front and rear surfaces of said first substrate, wherein said switch is a touch sensitive switch that generates a signal when touched by a person.

29. The rearview mirror element of claim 28, wherein said first electrical contact is disposed on the front surface of said first substrate.

30. The rearview mirror element of claim 28 and further comprising a plurality of switches, each switch having said first electrical contact disposed on a surface of said first substrate.

31. A rearview mirror element for use in a vehicle, the rearview mirror element comprising:
  a first substrate having a front surface and a rear surface;
  a reflective coating disposed on at least one of said surfaces of said first substrate; and
  an LED secured to the rear surface of said first substrate, wherein at least a portion of said rear surface of said first substrate functions as a circuit board.

32. The rearview mirror element of claim 31, wherein said mirror element is an electrochromic mirror element comprising a transparent second substrate positioned in front of said first substrate, wherein said reflective coating is applied to said front surface of said first substrate.

33. The rearview mirror element of claim 31, wherein said LED is secured to the rear surface of said first substrate such that light emitted from said LED is projected through said first substrate.

34. The rearview mirror element of claim 31, wherein said LED is secured to the rear surface of said first substrate such that light emitted from said LED is projected generally downward from the rearview mirror element.

35. The rearview mirror element of claim 31, wherein said LED includes leads that are secured to the rear surface of said first substrate using an electrically conductive adhesive.

36. The rearview mirror element of claim 35, wherein said electrically conductive adhesive is a conductive epoxy.

37. The rearview mirror element of claim 36 and further including spacers disposed within said electrically conductive adhesive underneath the leads of said LED.

38. A rearview mirror element for use in a vehicle, the rearview mirror element comprising:
  a first substrate having a front surface and a rear surface;
  a reflective coating disposed on at least one of said surfaces of said first substrate; and
  a light sensor secured to the rear surface of said first substrate, wherein at least a portion of said rear surface of said first substrate functions as a circuit board.

39. The rearview mirror element of claim 38, wherein said mirror element is an electrochromic mirror element comprising a transparent second substrate positioned in front of said first substrate, wherein said reflective coating is applied to said front surface of said first substrate.

40. The rearview mirror element of claim 39 and further comprising a drive circuit secured to the rear surface of said first substrate, said drive circuit controls the reflectivity of said electrochromic mirror element as a function of light levels sensed by said light sensor.

41. The rearview mirror element of claim 40, wherein said light sensor is configured and is secured to said first substrate to sense light passing through said first substrate.

42. The rearview mirror element of claim 40, wherein said light sensor is configured and is secured to said first substrate to sense light to the rear of said rear surface of said first substrate.

43. The rearview mirror element of claim 38, wherein said light sensor includes leads that are secured to the rear surface of said first substrate using an electrically conductive adhesive.

44. The rearview mirror element of claim 43, wherein said electrically conductive adhesive is a conductive epoxy.

45. The rearview mirror element of claim 44 and further including spacers disposed within said electrically conductive adhesive underneath the leads of said light sensor.

46. The rearview mirror element of claim 38, wherein said light sensor is a first light sensor, and wherein the rearview mirror element further comprises a second light sensor secured to the rear surface of said first substrate.

47. The rearview mirror element of claim 46, wherein said first and second light sensors are configured and secured to said first substrate to sense light from generally opposite directions.

48. A method of making a rearview mirror assembly for a vehicle, the method comprising:
  providing a mirror element having a rear surface and a front surface;
  inkjet printing conductive ink comprising a metal on one of the front and rear surfaces of the mirror element;
  providing a mirror housing having a bracket for attachment to a vehicle; and
  mounting the mirror element in the mirror housing.

49. The method of claim 48, wherein said ink is printed on the rear surface of the mirror element in the form of conductive tracings that are made of a metal material with a high resistivity so as to function as a heater for heating the mirror element when current passes through the tracings.

50. The method of claim 48, wherein said ink is printed on the rear surface of the mirror element in the form of metal conductive tracings that form part of an electrical circuit.

51. The method of claim 48, wherein said conductive ink comprises a metal selected from the group consisting of: copper, nickel, silver, gold, platinum, palladium, cobalt, and combinations and alloys thereof.

52. The method of claim 48, wherein said conductive ink comprises nanoparticles.

53. A rearview mirror element for use in a vehicle, the rearview mirror element comprising:
  a first substrate having a front surface and a rear surface;
  a reflective coating disposed on at least one of said surfaces of said first substrate; and
  a heat sink mounted to said first substrate, wherein at least a portion of said rear surface of said first substrate functions as a circuit board.

54. The rearview mirror element of claim 53 and further comprising an electrical component, wherein said heat sink is in thermal contact with said electrical component.

55. The rearview mirror element of claim 53, wherein said electrical component is an LED.

56. The rearview mirror element of claim 53 and further comprising electrically conductive tracings disposed on said rear surface of said first substrate.

57. The rearview mirror element of claim 56, wherein said electrically conductive tracings include at least one electrically resistive tracing in thermal contact with said heat sink.

* * * * *

UNITED STATES PATENT AND TRADEMARK OFFICE
CERTIFICATE OF CORRECTION

| | |
|---|---|
| PATENT NO. | : 7,706,046 B2 |
| APPLICATION NO. | : 10/863638 |
| DATED | : April 27, 2010 |
| INVENTOR(S) | : Frederick T. Bauer et al. |

Page 1 of 1

It is certified that error appears in the above-identified patent and that said Letters Patent is hereby corrected as shown below:

Column 5, line 35, "transfective" should be --transflective--.

Column 18, line 34, "311a" should be --310a--.

Column 21, line 32, "underst" should be --understood--.

Column 23, line 27, "displays As" should be --displays. As--.

Column 28, line 34, delete "circuit" (2nd occurrence).

Column 28, line 52, "review" should be --rearview--.

Column 28, line 55, "surface" should be --surfaces--.

Signed and Sealed this

Second Day of November, 2010

David J. Kappos
*Director of the United States Patent and Trademark Office*